United States Patent
Lee et al.

(10) Patent No.: US 11,435,622 B2
(45) Date of Patent: *Sep. 6, 2022

(54) LIQUID CRYSTAL DISPLAY DEVICE COMPRISING A PIXEL ELECTRODE HAVING A PLURALITY OF BRANCH PORTIONS AND A SECOND EDGE PORTION THAT IS SPACED APART FROM EACH OF THE BRANCH PORTIONS

(71) Applicant: Samsung Display Co. Ltd., Yongin-si (KR)

(72) Inventors: Se Hyun Lee, Seoul (KR); Hak Sun Chang, Yongin-si (KR); Cheol Shin, Hwaseong-si (KR)

(73) Assignee: SAMSUNG DISPLAY CO. LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/374,531

(22) Filed: Jul. 13, 2021

(65) Prior Publication Data
US 2021/0341796 A1 Nov. 4, 2021

Related U.S. Application Data

(63) Continuation of application No. 16/898,751, filed on Jun. 11, 2020, now Pat. No. 11,092,854, which is a (Continued)

(30) Foreign Application Priority Data

May 3, 2016 (KR) .................... 10-2016-0054473

(51) Int. Cl.
*G02F 1/1337* (2006.01)
*G02F 1/1333* (2006.01)
(Continued)

(52) U.S. Cl.
CPC .... *G02F 1/133707* (2013.01); *G02F 1/13394* (2013.01); *G02F 1/13439* (2013.01);
(Continued)

(58) Field of Classification Search
CPC ......... G02F 1/136218; G02F 1/134318; G02F 1/136272; G02F 1/133357
See application file for complete search history.

(56) References Cited

U.S. PATENT DOCUMENTS 6,952,252 B2  10/2005  Nakanishi
7,372,533 B2  5/2008  Inoue et al.
(Continued)

FOREIGN PATENT DOCUMENTS

CN   105158995   12/2015
EP   3 309 605   4/2018
(Continued)

OTHER PUBLICATIONS

Korean Office Action for Korean Patent Application or Patent No. 10-2016-0054473, dated Jun. 28, 2022.

*Primary Examiner* — Paul C Lee
(74) *Attorney, Agent, or Firm* — Kile Park Reed & Houtteman PLLC

(57) ABSTRACT

A liquid crystal display device includes a substrate, and a pixel electrode disposed on the substrate, the pixel electrode including a first stem portion that extends in a first direction, a second stem portion that extends in a second direction crossing the first direction and intersecting with the first stem portion, a plurality of branch portions, the branch portions extending to the first direction and the second direction from the first stem portion or the second stem portion, a first connection portion that connects distal ends of some of the branch electrodes to each other, extends in the first direction and intersects with the second stem portion,
(Continued)

and a first edge electrode that is connected to one distal end of the second stem portion and extends in the first direction.

16 Claims, 25 Drawing Sheets

Related U.S. Application Data continuation of application No. 16/268,724, filed on Feb. 6, 2019, now Pat. No. 10,712,621, which is a continuation of application No. 15/351,694, filed on Nov. 15, 2016, now Pat. No. 10,203,567.

(51) Int. Cl.
*G02F 1/1335* (2006.01)
*G02F 1/1339* (2006.01)
*G02F 1/1343* (2006.01)
*G02F 1/1362* (2006.01)
*H01L 27/12* (2006.01)

(52) U.S. Cl.
CPC .. *G02F 1/133345* (2013.01); *G02F 1/133512* (2013.01); *G02F 1/133514* (2013.01); *G02F 1/134309* (2013.01); *G02F 1/136286* (2013.01); *H01L 27/124* (2013.01); *G02F 1/133357* (2021.01); *G02F 2201/121* (2013.01); *G02F 2201/123* (2013.01)

(56) References Cited

U.S. PATENT DOCUMENTS

| | | | |
|---|---|---|---|
| 9,086,601 | B2 | 7/2015 | Jeong et al. |
| 10,203,567 | B2 | 2/2019 | Lee et al. |
| 11,092,854 | B2 * | 8/2021 | Lee .................. G02F 1/133345 |
| 2003/0086044 | A1 | 5/2003 | Inoue et al. |
| 2010/0001276 | A1 | 1/2010 | Kim et al. |
| 2010/0182557 | A1 | 7/2010 | You et al. |
| 2011/0069267 | A1 | 3/2011 | Moon et al. |
| 2013/0057813 | A1 | 3/2013 | Jeong et al. |
| 2013/0077031 | A1 | 3/2013 | Kim et al. |
| 2013/0250220 | A1 | 9/2013 | Kim et al. |
| 2014/0104532 | A1 | 4/2014 | Cho et al. |
| 2014/0125910 | A1 | 5/2014 | Kim et al. |
| 2014/0168582 | A1 | 6/2014 | Chang et al. |
| 2015/0009442 | A1 | 1/2015 | Lee et al. |
| 2015/0205168 | A1 | 7/2015 | Ryu et al. |

FOREIGN PATENT DOCUMENTS

| | | |
|---|---|---|
| JP | 10-203567 | 8/1998 |
| JP | 2016-167069 | 9/2016 |
| JP | 2016-191903 | 11/2016 |
| KR | 10-2003-0028701 | 4/2003 |
| KR | 10-2010-0023530 | 3/2010 |
| KR | 10-2013-0027370 | 3/2013 |
| KR | 10-2014-0109744 | 9/2014 |
| KR | 10-2015-0031640 | 3/2015 |
| KR | 10-2017-0099425 | 9/2017 |

* cited by examiner

LIQUID CRYSTAL DISPLAY DEVICE COMPRISING A PIXEL ELECTRODE HAVING A PLURALITY OF BRANCH PORTIONS AND A SECOND EDGE PORTION THAT IS SPACED APART FROM EACH OF THE BRANCH PORTIONS

CROSS-REFERENCE TO RELATED APPLICATIONS

This is a continuation application of U.S. patent application Ser. No. 16/898,751, filed Jun. 11, 2020, now U.S. Pat. No. 11,092,854 issued Aug. 17, 2021, the disclosure of which is incorporated herein by reference in its entirety. U.S. patent application Ser. No. 16/898,751 is a continuation application of U.S. patent application Ser. No. 16/268,724, filed Feb. 6, 2019, now U.S. Pat. No. 10,712,621, issued Jul. 14, 2020, the disclosure of which is herein by reference in its entirety. U.S. patent application Ser. No. 16/268,724 is a continuation application of U.S. patent application Ser. No. 15/351,694, filed Nov. 15, 2016, now U.S. Pat. No. 10,203,567, issued Feb. 12, 2019, the disclosure of which is herein by reference in its entirety. U.S. patent application Ser. No. 15/351,694 claims priority benefit of Korean Patent Application No. 10-2016-0054473 under 35 U.S.C. § 119, filed on May 3, 2016, the disclosure of which is incorporated herein by reference in its entirety for all purposes.

BACKGROUND

Field

Embodiments relate to a liquid crystal display device

Description of the Related Art

The liquid crystal display device is one of display devices that are most widely used at present. The liquid crystal display device includes two substrates formed with field-generating electrodes such as a pixel electrode and a common electrode, and a liquid crystal layer injected therebetween, and displays an image, by applying a voltage to the field-generating electrodes to form the electric field in the liquid crystal layer, and by determining the alignment of the liquid crystal of the liquid crystal layer and controlling the polarization of incident light.

SUMMARY

Embodiments are directed to a liquid crystal display device including a substrate, and a pixel electrode disposed on the substrate, the pixel electrode including a first stem electrode that extends in a first direction, a second stem electrode that extends in a second direction perpendicular to the first direction and intersects with the first stem electrode, a plurality of branch electrodes, the branch electrodes extending obliquely to the first direction and the second direction from the first stem electrode and the second stem electrode, a first connection electrode that connects distal ends of some of the branch electrodes to each other, extends in the first direction and intersects with the second stem electrode, and a first edge electrode that is connected to one distal end of the second stem electrode and extends in the first direction.

Embodiments are also directed to a liquid crystal display device including a substrate, a first gate line and a second gate line that are disposed on the substrate, extend in a first direction, and are insulated from each other, a data line that is disposed on the first gate line, is insulated from the first gate line and the second gate line, and extends in a second direction perpendicular to the first direction, and a pixel electrode that is disposed on the data line and is insulated from the first gate line, the second gate line, and the data line, the pixel electrode including a first stem electrode that extends in a first direction, a second stem electrode that extends in the second direction and intersects with the first stem electrode, a plurality of branch electrodes, the branch electrodes extending obliquely to the first direction and the second direction from the first stem electrode and the second stem electrode, a first connection electrode that connects distal ends of some of the branch electrodes to each other, extends in the first direction, and intersects with the second stem electrode, a second connection electrode that connects the distal ends of the remaining branch electrodes to each other, extends in the first direction, and intersects with the second stem electrode on an opposite side of the first connection electrode, and a first edge electrode that is connected to one distal end of the second stem electrode and extends in the first direction. The first edge electrode may be disposed between the first connection electrode and the first gate line, and the second connection electrode may be disposed to overlap the second gate line.

BRIEF DESCRIPTION OF THE DRAWINGS

Features will become apparent to those of skill in the art by describing in detail example embodiments with reference to the attached drawings in which.

DETAILED DESCRIPTION

Figure 1:
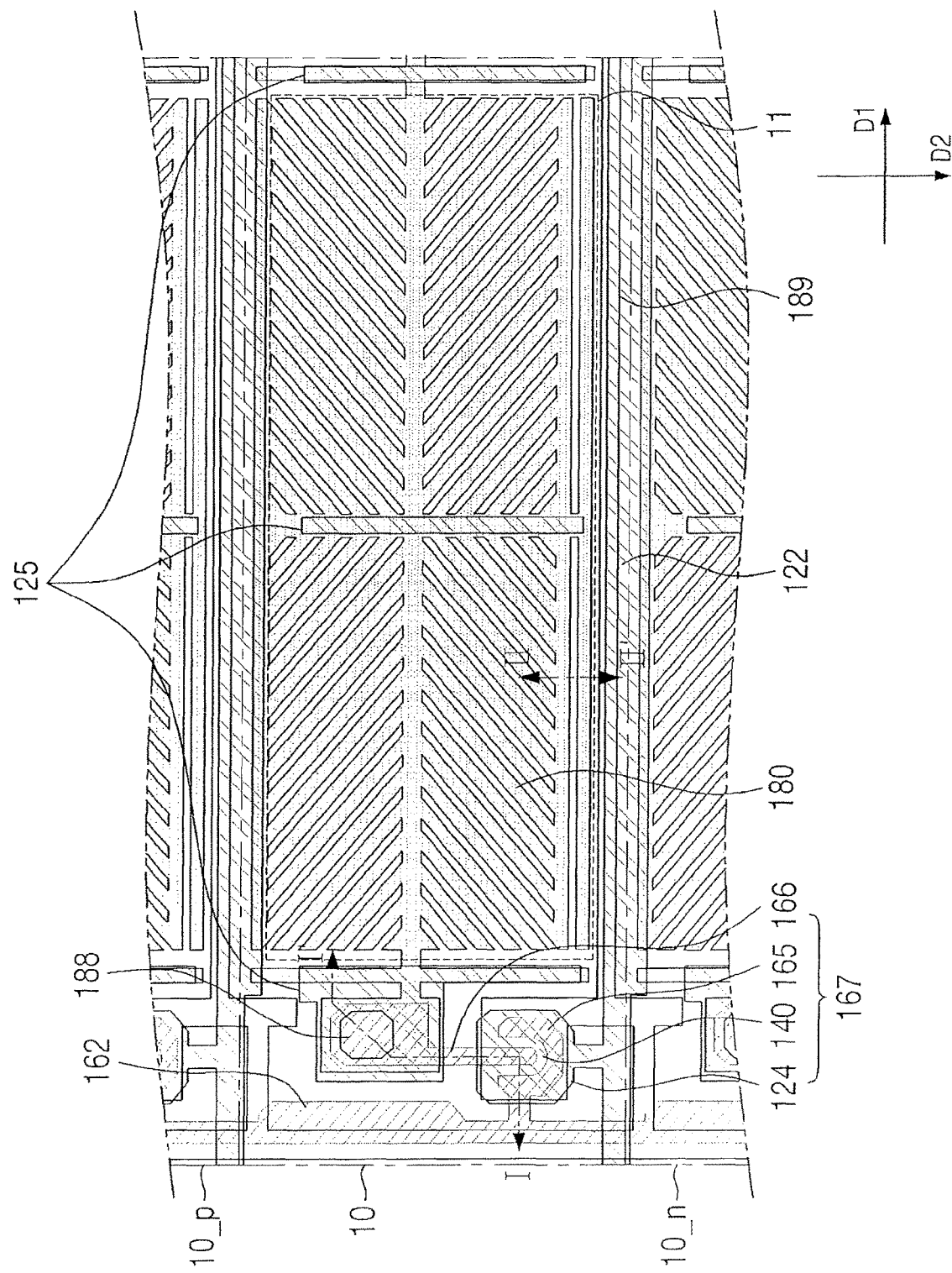
FIG. 1 illustrates a layout diagram of a first display substrate that is included in a liquid crystal display device according to an example embodiment, more specifically, illustrating a partial structure of a single pixel and two pixels adjacent thereto.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 2:
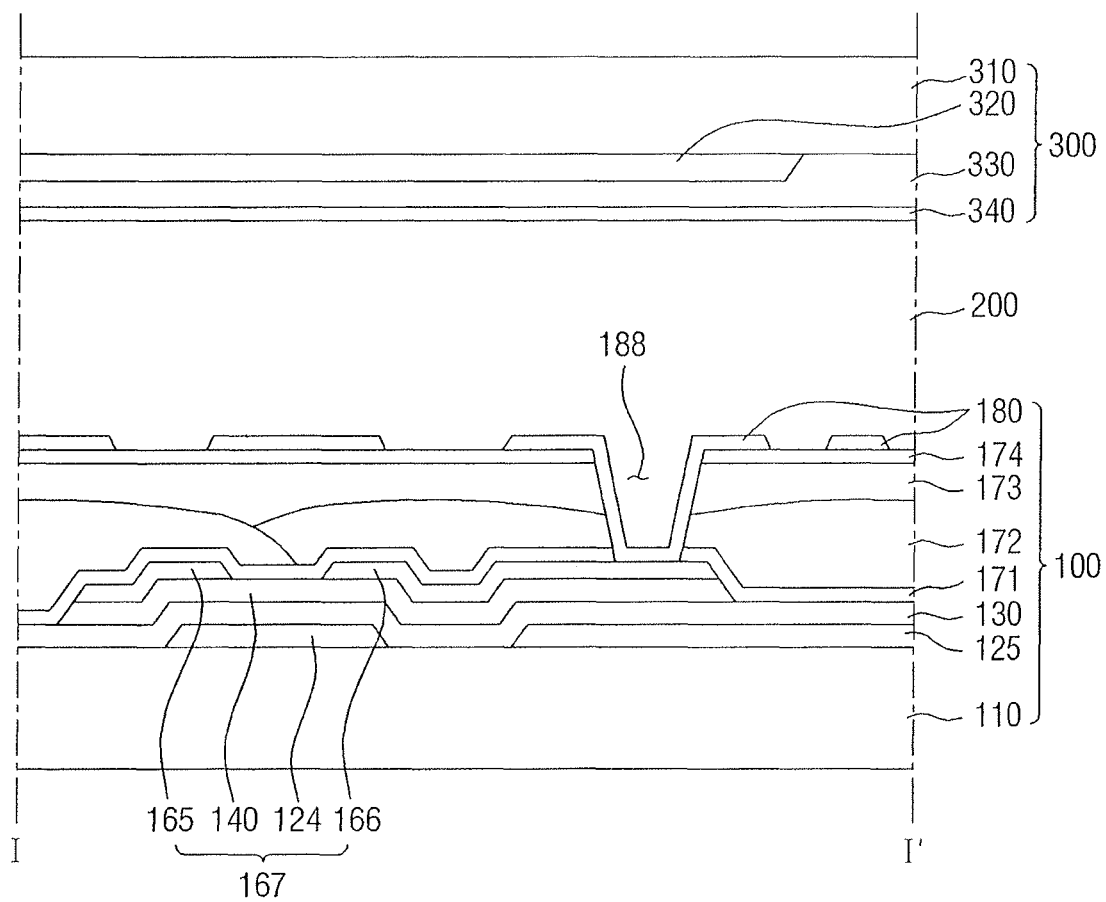
FIG. 2 illustrates a cross-sectional view of the liquid crystal display device including the first display substrate of FIG. 1 taken along line I-I' of FIG. 1.
Figure 3:
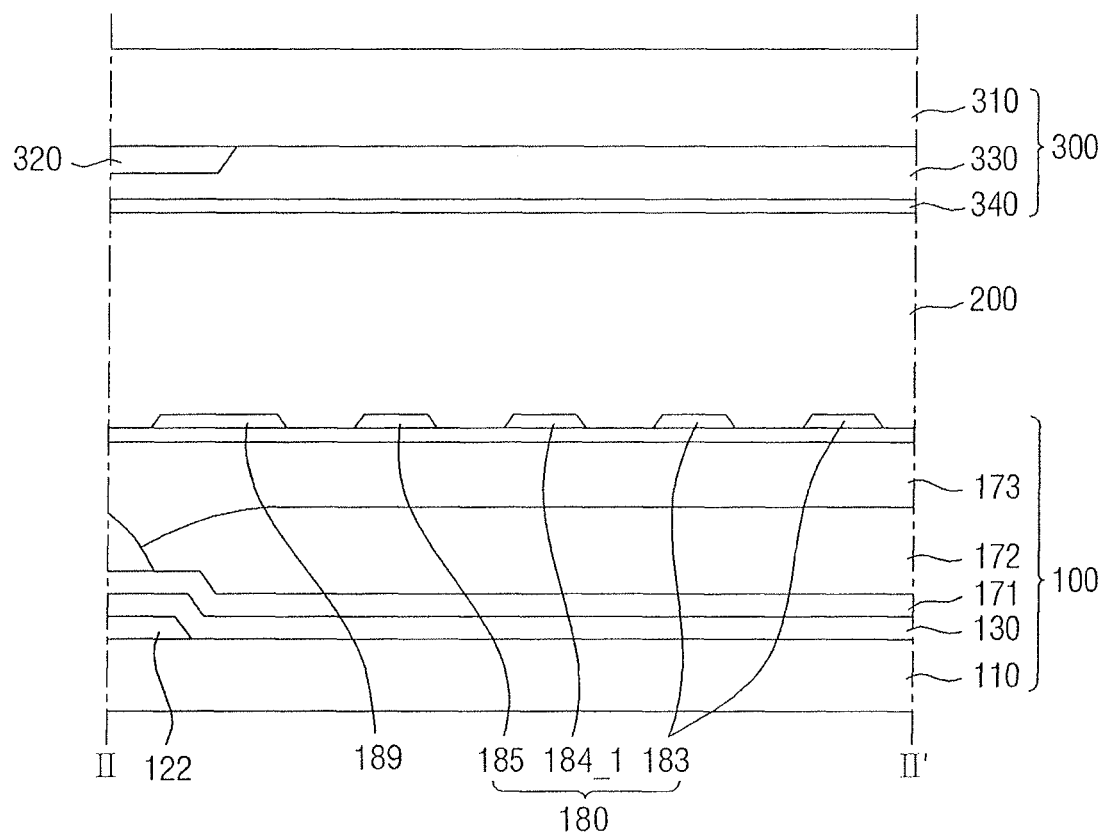
FIG. 3 illustrates a cross-sectional view of the liquid crystal display device including the first display substrate of FIG. 1 taken along the line II-II' of FIG. 1.
Figure 4:
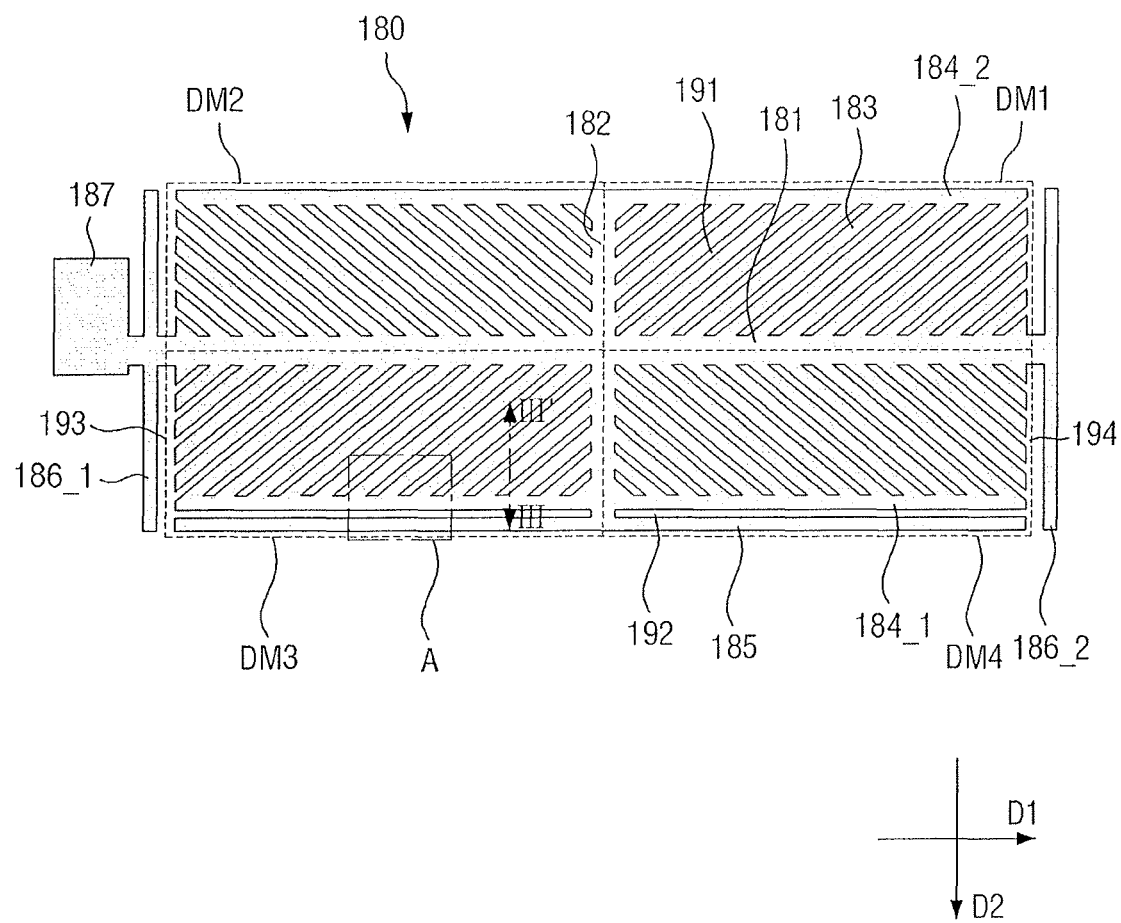
FIG. 4 illustrates a plan view of a pixel electrode of a single pixel of the liquid crystal display device including the first display substrate of FIG. 1.
Figure 5:
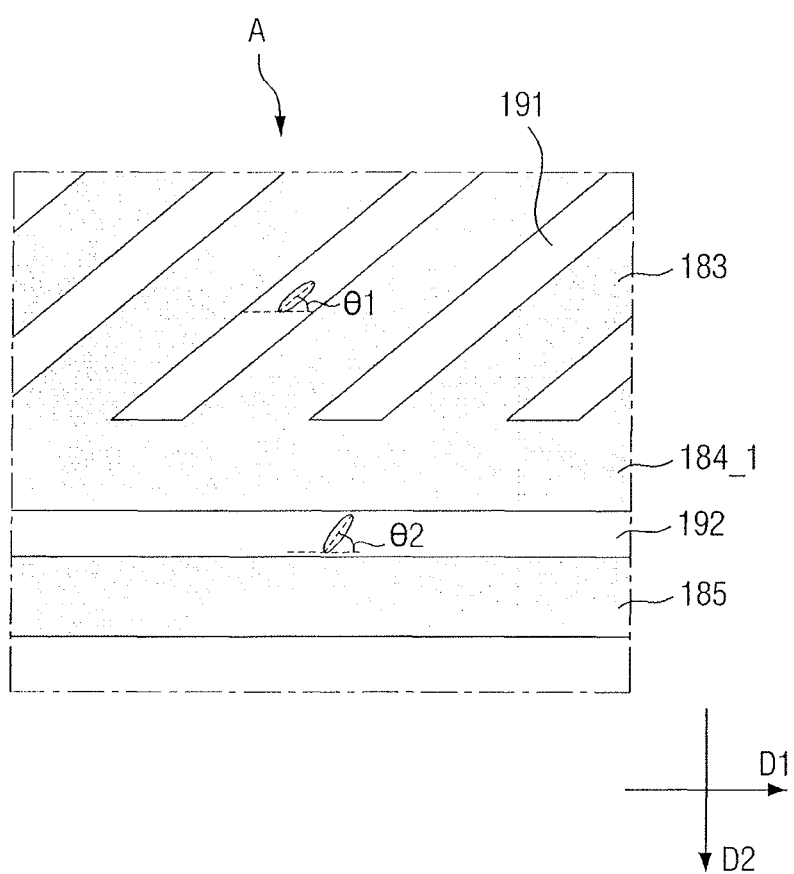
FIG. 5 illustrates an enlarged plan view illustrating a region A of FIG. 4.

FIG. 1 is a layout diagram of a first display substrate that is included in a liquid crystal display device according to an example embodiment, more specifically, illustrating a partial structure of a single pixel and two pixels adjacent thereto. FIG. 2 is a cross-sectional view of the liquid crystal display device including the first display substrate of FIG. 1 taken along line I-I' of FIG. 1. FIG. 3 is a cross-sectional view of the liquid crystal display device including the first display substrate of FIG. 1 taken along the line II-II' of FIG. 1. FIG. 4 is a plan view illustrating a pixel electrode of a single pixel of the liquid crystal display device including the first display substrate of FIG. 1. FIG. 5 is an enlarged plan view illustrating a region A of FIG. 4.

Referring to FIGS. 1 through 5, a liquid crystal display device according to an example embodiment includes a first display substrate 100, a second display substrate 300, and a liquid crystal layer 200. Furthermore, the liquid crystal display device may further include a pair of polarizers attached to the outside surfaces of the first display substrate 100 and the second display substrate 300.

A switching element for driving the liquid crystal 210 of the liquid crystal layer 200, for example, a thin film transistor 167, is disposed on the first display substrate 100. The second display substrate 300 is a substrate which is disposed to face the first display substrate 100.

The liquid crystal layer 200 is interposed between the first display substrate 100 and the second display substrate 300, and may include a plurality of liquid crystals 210 having dielectric constant anisotropy. When the electric field is applied between the first display substrate 100 and the second display substrate 300, the liquid crystal 210 may transmit or cut off light by rotating in a particular direction between the first display substrate 100 and the second display substrate 300. Here, the term "rotation" may include the meaning that the alignment of the liquid crystal 210 changes by the electric field, as well as the actual rotation of the liquid crystal 210.

The liquid crystal display device includes a plurality of pixels 10 arranged in the form of a matrix. The gradations of each pixel 10 can be independently controlled, and each pixel may be a basic unit for displaying a particular color. As shown in FIG. 2, each pixel 10 includes an active region 11, which is a region in which colors are actually displayed by transmitting the light incident on the bottom of the first display substrate 100 to the top of the second display substrate 300. A total of three pixels 10_p, 10, and 10_n are illustrated in FIG. 1 as an example. For convenience, on the basis of FIG. 1, the pixel 10 arranged at the top is referred to as a previous pixel 10_p and a pixel 10 arranged at the bottom is referred to as a next pixel 10_n. Further, a pixel 10 referred to without a special and additional description will be referred to as a pixel 10 disposed at the center of FIG. 1.

Hereinafter, the first display substrate 100 will be described.

Referring to FIG. 2, the first display substrate 100 includes a first base substrate 110. The first base substrate 110 may be a transparent insulating substrate. For example, the first base substrate 110 may be made of a glass substrate, a quartz substrate, a transparent resin substrate, or the like.

In some embodiments, the first base substrate 110 may also be curved along one direction. In some other embodiments, the first base substrate 110 may also have flexibility. For example, the first base substrate 110 may be deformed by rolling, folding, bending, or the like.

A gate line 122, a gate electrode 124, and a light-shielding pattern 125 are disposed on the first base substrate 110.

The gate line 122 transmits a gate signal that controls the thin film transistor 167, as described further below. The gate line 122 may have a shape extending in a first direction D1.

Here, the first direction D1 corresponds to a direction extending in parallel with one side of the first base substrate 110 on the plane in which the first base substrate 110 is disposed, and may be defined as a direction indicated by an arbitrary straight line that extends from left to right as illustrated in FIG. 1. However, the first direction does not need to be parallel to the one side of the first base substrate 110 and may also be a direction indicated by an arbitrary straight line extending in a specific direction on the first base substrate 110.

The gate signal may be a signal having a varying voltage value provided from the outside, and turning on/off of the thin film transistor 167 may be controlled to correspond to the voltage value of the gate signal.

The gate line 122 may extend along the first direction D1 for each pixel 10, and may be disposed over a boundary between the previous pixel 10_p and the pixel 10 or over a boundary the pixel 10 and the next pixel 10_n.

The gate electrode 124 may be formed as a protrusion from the gate line 122, and may be physically connected to the gate line 122. The gate electrode 124 may be a single component that makes up the thin film transistor 167, as described further below.

The light-shielding pattern 125 may cut off the transmission of the light through the first display substrate 100 and the second display substrate 300 in the region in which the light-shielding pattern 125 is disposed, and may help minimize a deterioration of display quality caused by scattering and reflection of light due to each constituent element, as described further below. The light shielding pattern 125 may be disposed on the first base substrate 110. The light-shielding pattern 125 may be disposed to be physically spaced apart from the gate line 122 and the gate electrode 124, and may be a conductor that is maintained in a floating state, i.e., a state in which a voltage is not directly applied.

The light-shielding pattern 125 may be disposed to overlap a contact hole 188, as described further below, or a second stem electrode 182, as described further below, and the arrangement thereof will be described below.

The gate line 122, the gate electrode 124, and the light-shielding pattern 125 may be made of the same material. As an example, the gate line 122, the gate electrode 124 and the light-shielding pattern 125 may contain an aluminum-based metal such as aluminum (Al) and aluminum alloy, a silver-based metal such as silver (Ag) and silver alloy, a copper-based metal such as copper (Cu) or copper alloy, a molybdenum-based metal such as molybdenum (Mo) and molybdenum alloy, chromium (Cr), tantalum (Ta) and titanium (Ti). The gate line 122, the gate electrode 124, and the light-shielding pattern 125 may have a single layer structure or may also have a multilayer structure that includes at least two conductive films with physical properties different from each other.

The gate insulating film 130 is disposed on the gate line 122, the gate electrode 124, and the light-shielding pattern 125. The gate insulating film 130 may be made of an insulating material, and as an example, it may be made of silicon nitride or silicon oxide. The gate insulating film 130 may be made of a single layer structure, or may have a multilayer structure including two insulating layers with physical properties different from each other.

A semiconductor layer 140 may be disposed on the gate insulating film 130. The semiconductor layer 140 may at least partially overlap the gate electrode 124. The semiconductor layer 140 may be formed of amorphous silicon, polycrystalline silicon, or an oxide semiconductor, etc.

The semiconductor layer 140 may overlap the gate electrode 124 and may also be disposed to overlap at least a part or all of a data line 162, a source electrode 165, and a drain electrode 166, as described further below, depending on the process procedure.

In some embodiments, an ohmic contact member may be additionally disposed on the semiconductor layer 140. The ohmic contact member may be formed of, for example, n+ hydrogenated amorphous silicon doped with n-type impurities at high concentration or may be formed of silicide. The ohmic contact members may be disposed in pairs on the semiconductor layer 140. The ohmic contact member may be disposed among the source electrode 165, the drain electrode 166, and the semiconductor layer 140 to allow them to have ohmic contact characteristics. In an implementation, the semiconductor layer 140 includes an oxide semiconductor and the ohmic contact member is omitted.

The data line 162, the source electrode 165, and the drain electrode 166 may be disposed on the semiconductor layer 140 and the gate insulating film 130.

The data line 162 may extend in the second direction D2 and may intersect with the gate line 122.

Here, the second direction D2 may be a direction intersecting with the first direction D1 on the plane in which the first base substrate 110 is disposed, and as illustrated in FIG. 1, the second direction may be a direction indicated by an arbitrary straight line extending from the lower side to the upper side. In some embodiments, the first direction D1 and the second direction D2 may perpendicularly intersect with each other.

The data line 162 may be insulated from the gate line 122, the gate electrode 124, and a sustain line by the gate insulating film 130.

The data line 162 may provide a data signal to the source electrode 165. Here, the data signal may be a signal having a varying voltage value provided from the outside, and the gradation of each pixel 10 may be controlled to correspond to the data signal.

The source electrode 165 may branch from the data line 162 and may at least partially overlap the gate electrode 124.

The drain electrode 166 may be disposed to be spaced apart from the source electrode 165 with the semiconductor layer 140 interposed therebetween on the basis of the viewing point of FIG. 1, and may at least partially overlap the gate electrode 124.

As illustrated in FIG. 1, the source electrode 165 may be formed in the form of surrounding the drain electrode 166 in a "U" shape at fixed intervals. However, the source electrode 165 may extend in a rod shape, and may also be disposed to be spaced apart from the drain electrode 166 in parallel at regular intervals, etc.

The semiconductor layer 140 may also be disposed in a region between the source electrode 165 and the drain electrode 166 formed by the source electrode 165 and the drain electrode 166 being spaced apart from each other. For example, the source electrode 165 and the drain electrode 166 partially overlap the semiconductor layer 140 or are in contact with the semiconductor layer 140, and may be disposed to face each other with the semiconductor layer 140 interposed therebetween.

The data line 162, the source electrode 165, and the drain electrode 166 may be made of the same material. As an example, the data line 162, the source electrode 165, and the drain electrode 166 may be made of aluminum, copper, silver, molybdenum, chromium, titanium, tantalum, or an alloy thereof. Further, the data line 162, the source electrode 165, and the drain electrode 166 may also have, for example, a multilayer structure having a lower film such as a refractory metal and a low-resistance upper film formed thereon.

The gate electrode 124, the semiconductor layer 140, the source electrode 165, and the drain electrode 166 may constitute the thin film transistor 167. The thin film transistor 167 may be disposed in a region other than the active region 11.

A first passivation film 171 may be disposed on the gate insulating film 130 and the thin film transistor 167. The first passivation film 171 may be made of an inorganic insulating material and may be disposed to cover the thin film transistor 167. The first passivation film 171 may protect the thin film transistor 167, and may prevent a substance contained in a color filter layer 172 and a planarization film 173 (to be described below) from flowing into the semiconductor layer 140.

A color filter layer 172 may be disposed on the first passivation film 171. The color filter layer 172 may be a photosensitive organic composition that contains a pigment for providing a color, and may include, for example, any one of red, green, and blue pigments. As an example, the color filter layer 172 may include a plurality of color filters. As an example, any one of the plurality of color filters may display one of primary colors such as three primary colors of red, green, and blue. In an implementation, the plurality of color filters may display any one of cyan, magenta, yellow, and white colors.

The planarization film 173 may be disposed on the color filter layer 172. The planarization film 173 may flatten a local step generated by components located between the planarization film 173 and the first base substrate 110. Thus, the upper surface of the planarization film 173 may be substantially flat.

A second passivation film 174 may be disposed on the planarization film 173. The second passivation film 174 may be made of an inorganic insulating material such as silicon oxide, silicon nitride, or silicon oxynitride, etc. The second passivation film 174 may help prevent the liquid crystal layer 200 from being contaminated by organic matter, such as solvent introduced from the planarization film 173 and the color filter layer 172. Thus, it may be possible to prevent a defect such as a residual image that may be generated at the time of driving the liquid crystal display device. In some embodiments, the second passivation film 174 may be omitted.

A contact hole 188 may be formed in the first passivation film 171, the color filter layer 172, the planarization film 173, and the second passivation film 174. The contact hole 188 may expose some of the thin film transistor 167 and, for example, some of the drain electrode 166 to the top along the direction perpendicular to the first base substrate 110. Some of the drain electrode 166 and the pixel electrode 180, as described further below, disposed at the top of the second passivation film 174 may be physically and electrically connected to each other through the contact hole 188.

The pixel electrode 180 and the shielding electrode 189 may be disposed on the second passivation film 174.

The pixel electrode 180 may receive the data signal from the drain electrode 166 by being physically and electrically connected to the drain electrode 166 through the contact hole 188.

The pixel electrode 180 may be made of a transparent conductive material such as indium tin oxide (ITO), indium zinc oxide (IZO), indium tin zinc oxide (ITZO), or Al-doped zinc oxide (AZO), etc.

The pixel electrodes 180, 180 may include an opening portion on which an electrically conductive material is not disposed. A pattern is formed on the pixel electrode 180 by the opening portion, and a tilted direction of the liquid crystal 210 disposed to overlap the pixel electrode 180 may be controlled depending on the shape and pattern of the pixel electrode 180.

The pixel electrode 180 includes a first stem electrode 181, a second stem electrode 182, a plurality of branch electrodes 183, a first connection electrode 184_1, a second connection electrode 184_2, a first edge electrode 185, a first auxiliary electrode 186_1, a second auxiliary electrode 186_2, and a protrusion 187.

Most of the components constituting the pixel electrode 180 are disposed in the active region 11, but some components, for example, the second connection electrode 184_2, the first auxiliary electrode 186_1, the second auxiliary electrode 186_2, and the protrusion 187, may be located outside the active region 11.

The first stem electrode 181 may extend along the first direction D1, and the second stem electrode 182 may extend along the second direction D2. The first stem electrode 181 and the second stem electrode 182 may intersect with each other in a cross shape, and may be physically connected to each other at the point of intersection.

The first stem electrode 181 and the second stem electrode 182 may be disposed in the active region 11 to form a cross shape. Thus, the active region 11 may be divided into four regions. Here, a region disposed at the right top from the intersection between the first stem electrode 181 and the second stem electrode 182 will be defined as a first domain region DM1, a region disposed at the left top will be defined as a second domain region DM2, a region disposed at the left bottom will be defined as a third domain region DM3, and a region disposed at the right bottom will be defined as a fourth domain region DM4.

A plurality of branch electrodes 183 may be provided. The branch electrodes 183 may extend in an oblique direction that is not parallel to the first direction D1 or the second direction D2 from the first stem electrode 181 and the second stem electrode 182. The branch electrodes 183 may extend in the same direction within each domain region. For example, the branch electrodes 183 may extend to face the right top in the first domain region DM1, may extend to face the left top in the second domain region DM2, may extend to face the left bottom in the third domain region DM3, and may extend to face the right bottom in the fourth domain region DM4.

An absolute value of an included angle formed between the branch electrode 183 and the first direction D1 may be, for example, 30° to 60° in each of the first to fourth domain regions DM1, DM2, DM3, and DM4. For example, the absolute value of the included angle formed between each first branch electrode 183 and the first direction D1 may be about 45°.

First fine slits 191 are disposed between the branch electrodes 183 disposed in parallel with each other. The first fine slits 191 may be opening portions in which a transparent conductive material is not disposed. Because the first fine slits 191 are disposed between the two branch electrodes 183 disposed in parallel with each other, the first fine slits 191 may extend along the same direction as the extending direction of the branch electrodes 183 adjacent to each other in each domain region.

The first connection electrode 184_1 and the second connection electrode 184_2 connect the distal ends of the branch electrodes 183 to each other, extend along the first direction D1, and are disposed to intersect with the second stem electrode 182. For example, the first connection electrode 184_1 may connect the distal ends of the branch electrodes 183 disposed in the third domain region DM3 and the fourth domain region DM4 to each other. The second connection electrode 184_2 may connect the distal ends of the branch electrodes 183 disposed in the first domain region DM1 and the second domain region DM2 to each other. Consequentially, the first connection electrode 184_1 extends in parallel with the first stem electrode 181 and is disposed at the bottom of the first stem electrode 181, and the second connection electrode 184_2 extends in parallel with the first stem electrode 181 and may be disposed at the top of the first stem electrode 181.

Because the first connection electrode 184_1 and the second connection electrode 184_2 connect the distal ends of the branch electrodes 183 in which the electric field formed in the liquid crystal layer 200 is likely to be irregularly formed, it is possible to prevent the misalignment of the liquid crystal 210 and a decrease in transmittance at the distal ends of the branch electrodes 183.

The first edge electrode 185 extends along the first direction D1 and is disposed to be connected to one distal end of the second stem electrode 182. The first edge electrode 185 may be connected to the distal end close to the gate line 122 connected to the control terminal of the thin film transistor 167, of the two distal ends of the second stem electrode 182. Thus, the first edge electrode 185 is disposed adjacent to the first connection electrode 184_1 and in parallel with the first connection electrode 184_1 at intervals, and the first edge electrode 185 may be disposed to form a 180° rotation shape of a "T" shape with the second stem electrode 182. Further, as illustrated in FIG. 1, from the viewing point of viewing the first base substrate 110, the first edge electrode 185 is disposed adjacent to the gate line 122 and in parallel with the gate line 122 at intervals, and may be disposed in parallel with the gate line 122 at intervals. Consequentially, the first connection electrode 184_1, the first edge electrode 185, and the gate line 122 extend in parallel with one another along the first direction D1, and the first edge electrode 185 may be disposed between the first connection electrode 184_1 and the gate line 122.

A second fine slit 192 is disposed between the first connection electrode 184_1 and the first edge electrode 185. The second fine slit 192 may be an opening portion in which a transparent conductive material is not disposed. Because the second fine slit 192 is disposed between the first connection electrode 184_1 and the first edge electrode 185 extending in the first direction D1 and disposed in parallel with each other, the second fine slit 192 may extend along the first direction D1 similarly to the first connection electrode 184_1 and the first edge electrode 185.

With the arrangement of the aforementioned first edge electrode 185, the effect of improving the visibility and improving the transmittance can be maximized in the region in which the first edge electrode 185 and the second fine slit 192 are disposed.

For example, the display qualities of the pixel electrode 180 and the gate line 122 for controlling the same may be degraded due to a kick-back phenomenon when overlapping. Here, when the kick-back phenomenon is a phenomenon in which, when the gate signal provided to the gate line 122 changes from an on-level voltage value to an off-level voltage value, the voltage charged to the pixel electrode 180 drops under its influence. Because this reduces the charging rate of the pixel electrode 180 and causes a user to recognize blinking, or the like, there is a risk of a degradation of display quality. Accordingly, the pixel electrode 180 and the gate line 122 for controlling the same are disposed at a fixed interval to minimize the kickback phenomenon. Thus, the control of the liquid crystal 210 may be incomplete in the region between the pixel electrode 180 and the gate lines 122, and the first edge electrode 185 may be disposed adjacent to the gate line 122 and in parallel with the gate line 122 and may suppress the degradation of the visibility and the decrease in transmittance due to the gate line 122. The specific description of the principles of improvement in the visibility and improvement in the transmittance of the first edge electrode 185 will be described later with reference to FIG. 5.

The second connection electrode 184_2 may be disposed to overlap the gate line 122 of the previous pixel 10_p. The reason is that the gate line 122 of the previous pixel 10_p does not induce a kickback phenomenon in the pixel electrode 180 because it is a pixel in which the operation is already finished. For example, as the gate line 122 of the previous pixel 10_p and the pixel electrode 180 are disposed close to each other to such an extent that the second connection electrode 184_2 overlaps the gate line 122 of the previous pixel 10_p, an arrangement region of the pixel electrode 180 may be maximized. Accordingly, the transmittance may be maximized.

Each of the first auxiliary electrode 186_1 and the second auxiliary electrode 186_2 extends along the second direction D2 and is disposed so as to be connected to both distal ends of the first stem electrode 181. The first auxiliary electrode

186_1 and the second auxiliary electrode 186_2 may be disposed to be spaced apart from the distal end of the adjacent branch electrode 183.

A third fine slit 193 as an opening portion extending along the second direction D2 is formed between the first auxiliary electrode 186_1 and the branch electrode 183 adjacent thereto, and a fourth fine slit 194 as an opening portion extending along the second direction D2 may be formed between the second auxiliary electrode 186_2 and the branch electrode 183 adjacent thereto.

Some of a region in which the first auxiliary electrode 186_1 and the second auxiliary electrodes 186_2 are disposed may overlap the light-shielding pattern 125, and may not transmit the light accordingly. However, the first auxiliary electrode 186_1 and the second auxiliary electrode 186_2 may improve the visibility of the region in which the third fine slit 193 and the fourth fine slit 194 are disposed by interaction with the adjacent branch electrode 183 and may improve the transmittance.

The protrusion 187 is for connection with another layer, and protrudes from the first stem electrode 181. However, the protrusion 187 may also protrude from the second stem electrode 182 in some embodiments, without being limited to protruding from the first stem electrode 181, and the protrusion 187 may also protrude from one of the branch electrode 183, the first connection electrodes 184_1, the second connection electrode 184_2, the first edge electrode 185, the first auxiliary electrode 186_1 and the second auxiliary electrode 186_2. The protrusions 187 may be electrically connected to the drain electrode 166 through the contact hole 188.

The extended length of the first stem electrode 181 may be longer than the extended length of the second stem electrode 182. For example, the extension width of the active region 11 along the first direction D1 may be greater than the extension width along the second direction D2. In this case, the previous pixel 10_p, the pixel 10, and the next pixel 10_n that are consecutively arranged along the second direction D2 may be different from one another in the color of the color filter layer 172. For example, the previous pixel 10_p, the pixel 10 and the next pixel 10_n that are consecutively arranged along the second direction D2 may be each of a red pixel 10 for displaying red, a green pixel 10 for displaying green, and a blue pixel 10 for displaying blue. Thus, the red pixel 10, the green pixel 10, and the blue pixel 10 that are consecutively arranged along the second direction D2 are gathered one by one, and may become a basic unit which is recognized as a single color.

In this ways, when the extended length of the first stem electrode 181 is longer than the extended length of the second stem electrode 182, the number of pixels 10 arranged along the second direction D2 increases, but the number of pixels 10 arranged along the first direction D1 decreases accordingly. Consequentially, the number of gate lines 122 extending along the first direction D1 increases, but the number of data lines 162 extending along the second direction D2 decreases accordingly. Therefore, the required number of gate drivers for providing the gate signal to the gate line 122 increases, but the required number of data drivers for providing the data signal to the data line 162 decreases accordingly. In general, because the manufacturing cost of the gate drivers is lower than the manufacturing cost of the data drivers, the manufacturing cost of the liquid crystal display device can be reduced accordingly.

The shielding electrode 189 is disposed on the same layer as the pixel electrode 180 and is formed of the same material, but the shielding electrode 189 is physically spaced apart from and is electrically insulated from the pixel electrode 180. The shielding electrode 189 may be made of a transparent conductive material, and the shielding electrode 189 and the pixel electrode 180 may be simultaneously formed in the same process using a single optical mask.

The shielding electrode 189 may be disposed in a portion corresponding to the gate line 122 and the data line 162, of the top of the second passivation film 174. For example, the shielding electrode 189 is disposed on the upper side of the gate line 122 and the data line 162 to be insulated from the gate line 122 and the data line 162, and may extend along the extension direction of each of the gate line 122 and the data line 162.

A voltage having the same level as the common signal provided to a common electrode 340, as described further below may be provided to the shielding electrode 189. However, the shielding electrode 189 may also maintain a floating state that is a state in which the voltage is not intentionally provided, without being limited thereto. Thus, it is possible to minimize a phenomenon in which the liquid crystal layer 200 disposed in the upper direction of the shielding electrode 189 is affected depending on the change in the voltage values of the gate line 122 and the data line 162 arranged in the lower direction of the shielding electrode 189, thereby improving the display quality.

Meanwhile, a first alignment film may be further arranged on the pixel electrode 180. The first alignment film may control an initial alignment angle of the liquid crystal 210 injected into the liquid crystal layer 200.

Hereinafter, the second display substrate 300 will be described.

The second display substrate 300 includes a second base substrate 310, a light-shielding member 320, an overcoat layer 330, and a common electrode 340.

The second base substrate 310 is disposed to face the first base substrate 110. The second base substrate 310 may have durability capable of withstanding an external impact. The second base substrate 310 may be a transparent insulating substrate. For example, the second base substrate 310 may be made of a glass substrate, a quartz substrate, a transparent resin substrate, or the like. The second base substrate 310 may be a flat plate type but may also be curved in a particular direction.

The light-shielding member 320 is disposed on a surface of the second base substrate 310 that faces the first display substrate 100. The light-shielding member 320 may be disposed to overlap the gate line 122, the data line 162, the thin film transistor 167, and the contact hole 188, for example, to overlap the regions other than the active region 11, and may cut off the transmission of light in the regions other than the active region 11.

The overcoat layer 330 is disposed on a surface of the light-shielding member 320 that faces the first display substrate 100. The overcoat layer 330 may alleviate a step caused by the light-shielding member 320. In some embodiments, the overcoat layer 330 may be omitted.

The common electrode 340 is disposed on a surface of the overcoat layer 330 that faces the first display substrate 100. The common electrode 340 may be made of a transparent conductive material such as indium tin oxide (ITO), indium zinc oxide (IZO), indium tin zinc oxide (ITZO) and Al-doped zinc oxide (AZO). The common electrode 340 may be formed by a single board over the entire surface of the second base substrate 310. The common signal provided from the outside is provided to the common electrode 340 and may form an electric field to the liquid crystal layer 200 with the pixel electrode 180.

Meanwhile, a second alignment film may be disposed on a surface of the common electrode 340 that faces the first display substrate 100. The second alignment film may control an initial alignment angle of the liquid crystal 210 injected into the liquid crystal layer 200, similarly to the first alignment film.

The liquid crystal layer 200 will be described below.

The liquid crystal layer 200 includes a plurality of liquid crystals 210 having dielectric anisotropy and refractive index anisotropy. The liquid crystals 210 may be aligned in the direction perpendicular to the first display substrate 100 and the second display substrate 300, in a state in which the electric field is not formed on the liquid crystal layer 200. When an electric field is formed between the first display substrate 100 and the second display substrate 300, the liquid crystals 210 may change the polarization of light by rotating or tilting in a particular direction between the first display substrate 100 and the second display substrate 300.

The effect of improving the visibility will be more specifically described below.

FIG. 5 illustrates a direction in which the liquid crystal 210 disposed in the region A of FIG. 5 is tilted in a state in which a predetermined voltage is provided to the pixel electrode 180. FIG. 5 illustrates a state in which the predetermined electric field is formed in the liquid crystal layer 200 and the liquid crystals 210 are tilted when the first display substrate 100 is viewed from the top, and an extension direction of the long axis of the liquid crystals 210 means a direction in which the liquid crystals 210 are tilted.

Referring to FIG. 5, the liquid crystal 210 overlapping the first fine slit 191 may be tilted to form a first included angle (θ1) with the first direction D1. Further, the liquid crystal 210 overlapping the second fine slit 192 may be tilted to form a second included angle (θ2) with the first direction D1. However, because there are a very large number of liquid crystals 210 disposed to overlap the first fine slits 191, it is a matter of course that the long axis of the liquid crystal 210 and the first direction D1 may form an angle other than the first included angle (θ1). However, because most of the liquid crystals 210 form an angle close to the first included angle (θ1), this will be mainly described for convenience. This may also be applied to the liquid crystal 210 disposed to overlap the second fine slit 192.

Here, the included angle formed with the first direction D1 means an acute angle of the two included angles formed with the first direction D1. In a case where the included angle becomes a positive (+) value when measured in a clockwise direction from the first direction D1, the included angle is measured in the clockwise direction. In a case where the included angle becomes the positive value when measured in a counterclockwise direction from the first direction D1, the include angle indicates the value measured in the counterclockwise direction.

When a predetermined voltage is applied to the pixel electrode 180, the liquid crystal 210 disposed in the first fine slit 191 may be tilted along a direction parallel to the extension direction of the branch electrode 183. The extension direction of the first electrode 183 may form an included angle of about 45° with the first direction D1. Thus, the first included angle may also be about 45°.

Here, the included angle formed between the long axis of the liquid crystal 210 and the first direction D1 is about 45°. Thus, it may be advantageous for the visibility by interaction with the pair of polarizers. Thus, the liquid crystal 210 disposed in the first fine slit 191 may be tilted in a direction that is advantageous for the visibility.

When a predetermined voltage is provided to the pixel electrode 180, the liquid crystal 210 disposed in the second fine slit 192 may be tilted to form a second included angle θ2 with the first direction D1. The first included angle θ1 may be larger than the second included angle θ2. However, even if the second included angle θ2 is larger than the first included angle θ1, the second included angle θ2 may have an angle less than 90° by the first edge electrode 185. For example, because the force in which the liquid crystal 210 attempts to tilt acts from the distal end of the first edge electrode 185 in the direction of the portion in which the first edge electrode 185 and the second stem electrode 182 intersect with each other, the second included angle θ2 may have a value that is less than 90° and is about 45°, rather than having the value of 90°. Accordingly, the visibility of the region in which the second fine slit 192 is disposed may be improved by the arrangement of the first edge electrode 185. Further, as the visibility of the arrangement region of the second fine slit 192 is improved, the liquid crystal 210 of the arrangement region of the first edge electrode 185 and the first connection electrode 184_1 as an adjacent region is also affected, and the visibility may be improved.

Improvements in visibility and transmittance will be described referring to FIGS. 6 to 10.

Figure 6:
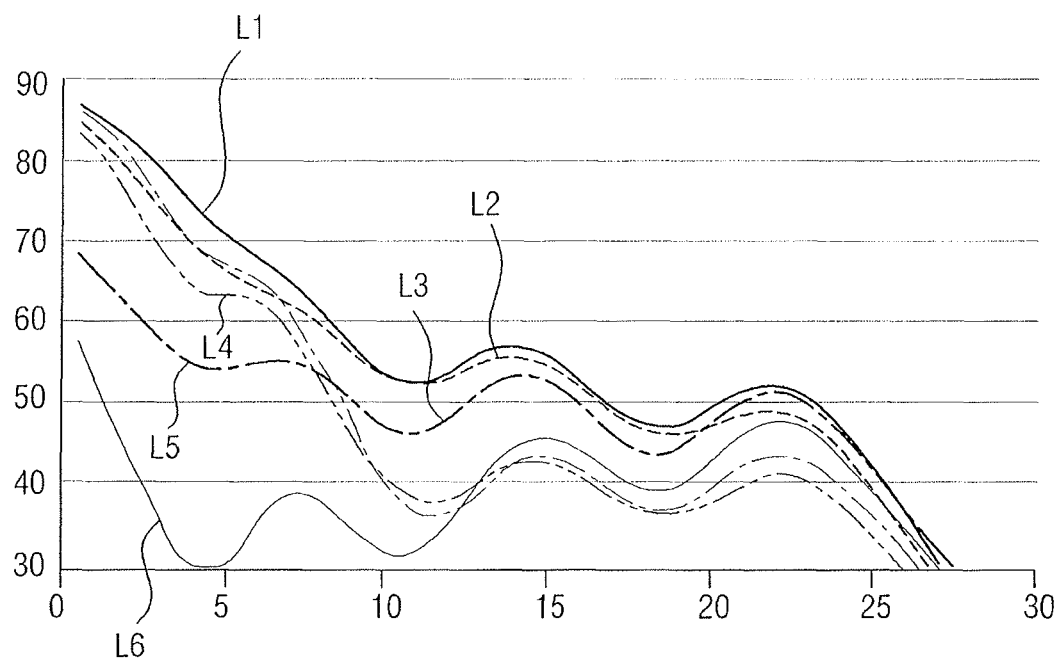
FIG. 6 illustrates a graph of the direction in which the liquid crystal is tilted along III-III' of FIG. 4 through measurement.

FIG. 6 is a graph illustrating the direction in which the liquid crystal is tilted along the line of FIG. 4 through measurement.

An x-axis of the graph in FIG. 6 represents a distance measured in a direction in which a point indicated by III' is disposed on the basis of a point indicated by III in FIG. 4 as an origin point, and its unit may be μm. In the graph of FIG. 6, a y-axis represents an included angle formed with the first direction D1 of FIG. 4.

In the graph of FIG. 6, a first line L1, a second line L2, and a third line L3 represent an included angle formed between the liquid crystal 210 tilted by the structure of the pixel electrode 180 of the liquid crystal display device according to a comparative example and the first direction D1. A fourth line L4, a fifth line L5, and a sixth line L6 represent an included angle formed between the liquid crystal 210 inclined by the structure of the pixel electrode 180 illustrated in FIG. 4 and the first direction D1.

Here, the structure of the pixel electrode 180 of the liquid crystal display device according to a comparative example means a structure in which the first edge electrode 185 is omitted from of the pixel electrode 180 structure illustrated in FIG. 4, the length of the branch electrode 183 is further extended, and the first connection electrode 184_1 is disposed at a location of the existing first edge electrode 185. For example, it means a structure in which the first edge electrode 185 is omitted.

Further, the first line L1 and the fourth line L4 are measured values when the first voltage level is applied to the pixel electrode 180, the second line L2 and the fifth line L5 are measured values when the second voltage level is applied to the pixel electrode 180, and the third line L3 and the sixth line L6 are measured values when the third voltage level is applied to the pixel electrode 180. Here, the second voltage level has a voltage value higher than the first voltage level, and the third voltage level may have a voltage value higher than the second voltage level.

Referring to FIG. 6, the fourth line L4 is illustrated on a lower side than the first line L1, the fifth line L5 is illustrated on a lower side than the second line L2, and the sixth line L6 is illustrated on a lower side than the third line L3. For example, in the case of the structure of the pixel electrode 180 according to an example embodiment including the first edge electrode 185, the included angle formed between the liquid crystal 210 and the first direction D1 may be about 45°, as compared to the case of the structure of the pixel electrode 180 according to the comparative example. For example, it is possible to check that the visibility is improved.

Further, as indicated in all of the first to third voltage levels, it is possible to check that the visibility is improved in most cases of the voltage level applied to the pixel electrode 180.

Figure 7:
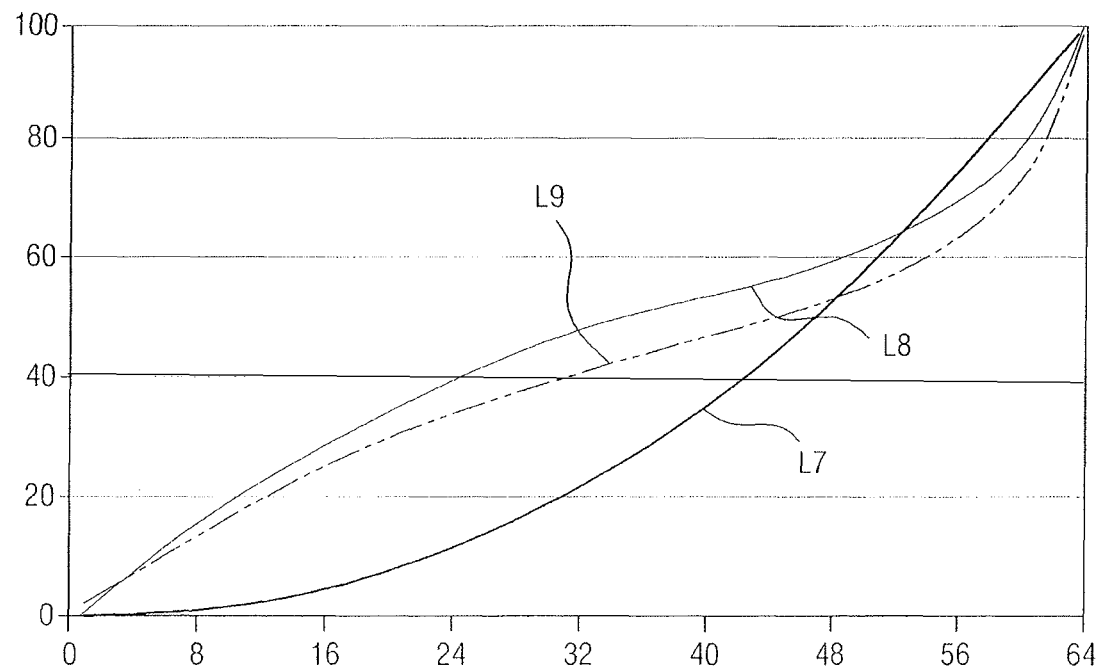
FIG. 7 illustrates a graph of the degree of improvement in visibility of the liquid crystal display device according to the embodiment illustrated in FIG. 1.

FIG. 7 is a graph illustrating the degree of improvement in visibility of the liquid crystal display device according to the embodiment illustrated in FIG. 1.

An x-axis of the graph of FIG. 7 represents the gradation of each pixel 10, and a y-axis represents the brightness. A maximum value of brightness represented by the y-axis is 100, and its unit is %. In this graph, the reference of the maximum value of brightness will be defined as a case where the liquid crystal display device having a gradation of 64 is viewed from the front.

The seventh line L7 in the graph of FIG. 7 represents brightness for each gradation when the liquid crystal display device according to the comparative example is viewed from the front, the eighth line L8 represents brightness for each gradation when the liquid crystal display device according to the comparative example is viewed from the side, and the ninth line L9 represents brightness for each gradation when the liquid crystal display device according to the embodiment illustrated in FIG. 1 is viewed from the side.

Referring to FIG. 7, in most of the gradations, for example, in the gradations in the range of 0 to 50, the ninth line L9 may be relatively closer to the seventh line L7 than the eighth line L8. For example, in a certain gradation among the gradations in the range of 0 to 50, a difference in measured values along the ninth line L9 and the seventh line L7 may be smaller than a difference in measured values along the eighth line L8 and the seventh line L7. Consequentially, it is possible to understand that the liquid crystal display device according to the embodiment illustrated in FIG. 1 has a difference in front brightness smaller than that of the liquid crystal display device according to the comparative example in most gradation ranges. Accordingly, it is possible to check that the visibility is improved in the case of the liquid crystal display device according to the embodiment illustrated in FIG. 1.

Figure 8:
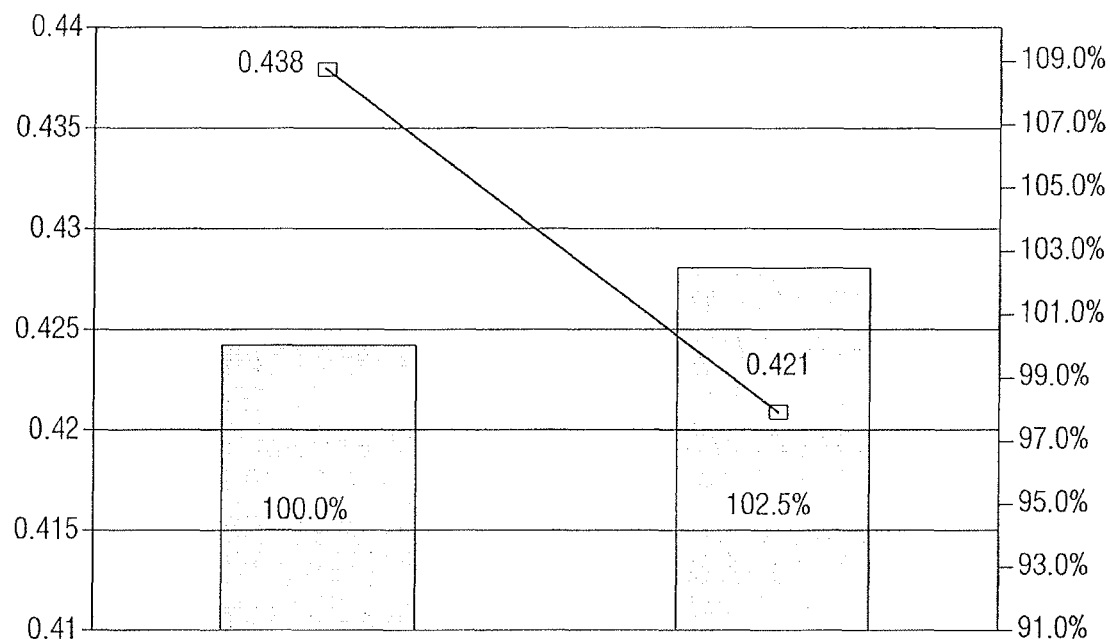
FIG. 8 illustrates a graph of the degrees of improvement in transmittance and visibility of the liquid crystal display device according to the embodiment illustrated in FIG. 1.

FIG. 8 is a graph illustrating the degree of improvements in transmittance and visibility of the liquid crystal display device according to the embodiment illustrated in FIG. 1.

In the graph of FIG. 8, both of a bar graph and a line graph are illustrated. Among them, the bar graph represents the value of the transmittance in unit of %, and the line graph represents the value of visibility. The values of y-axis recorded on the left represent the value of the visibility, and the values of y-axis recorded on the right represent the value of the transmittance.

Further, the values of the bars and lines described on the left represent the measured values of the case according to the comparative example, and bars and the lines described on the right represent the measured values of the case according to the embodiment illustrated in FIG. 1.

Referring to FIG. 8, in the case according to the comparative example described above, the transmittance is measured as 100%, and the visibility is measured as 0.438. Meanwhile, in the case according to the embodiment illustrated in FIG. 1, the transmittance is measured as 102.5%, and the visibility is measured as 0.421. Here, as the value of the visibility is low, it means that a difference in brightness between the front and the side is small. As a result, it is possible to understand that the transmittance increases and the visibility is improved according to an example embodiment.

Figure 9:
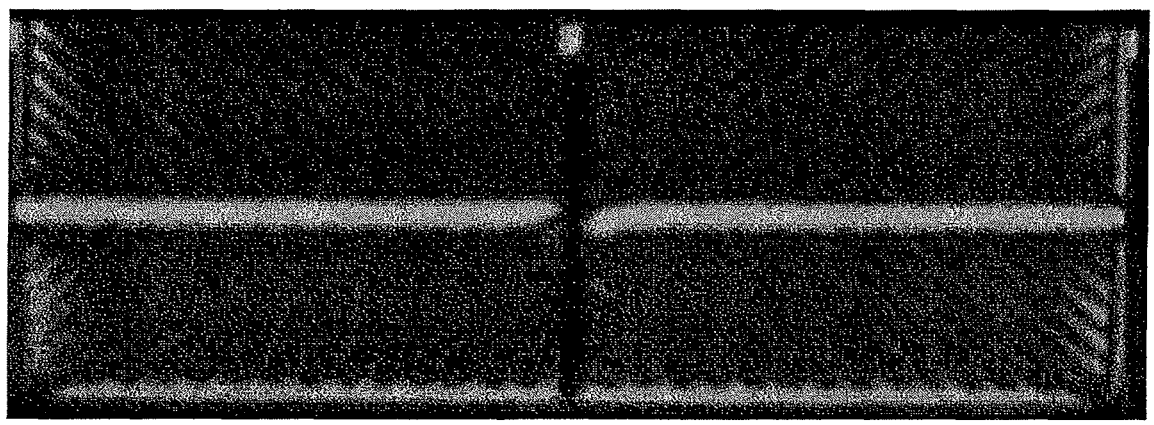
FIG. 9 illustrates a photograph obtained in the case of viewing a region corresponding to an active region of the liquid crystal display device according to the embodiment illustrated in FIG. 1 from the front, in a liquid crystal display device according to a comparative example.
Figure 10:
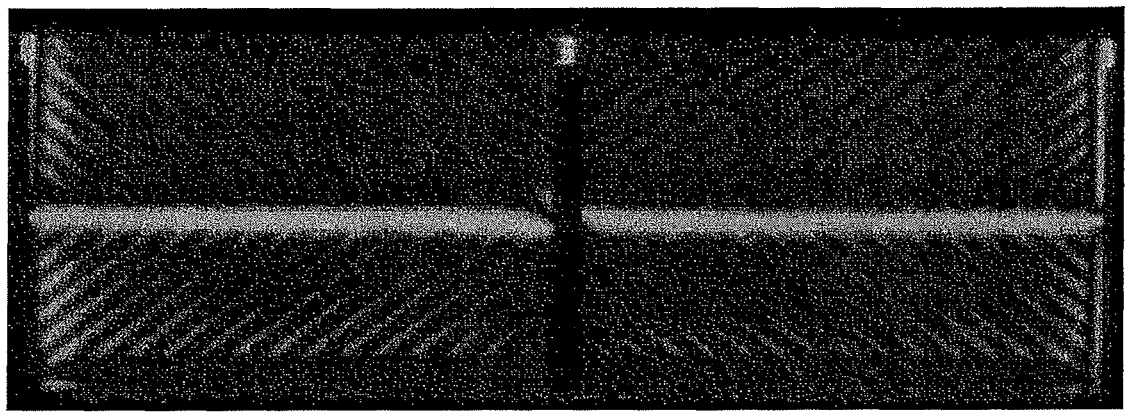
FIG. 10 illustrates a photograph obtained in the case of viewing the active region of the liquid crystal display device according to the embodiment illustrated in FIG. 1 from the front.

FIG. 9 is a photograph obtained when a region corresponding to an active region of the liquid crystal display device according to the embodiment illustrated in FIG. 1 is viewed from the front, in the liquid crystal display device according to the comparative example, and FIG. 10 is a photograph obtained when the active region of the liquid crystal display device according to the embodiment illustrated in FIG. 1 is viewed from the front.

Referring to FIGS. 9 and 10, in the case of the liquid crystal display device according to the comparative example, it is possible to check that the lower end of the region corresponding to the active region 11 is viewed brightly but just above the brightly viewed lower end is viewed darkly. Meanwhile, in the case of the liquid crystal display device according to the embodiment illustrated in FIG. 1, it is possible to check that the lower end portion of the active region 11 has a uniform brightness. Therefore, in the case of the liquid crystal display device according to the embodiment illustrated in FIG. 1, since it represents a generally uniform brightness in the active region 11, it is possible to check that the display quality is improved as compared to the liquid crystal display device according to the comparative example.

As described in detail below, the shape of the pixel electrode 180 may be variously modified.

Figure 11:
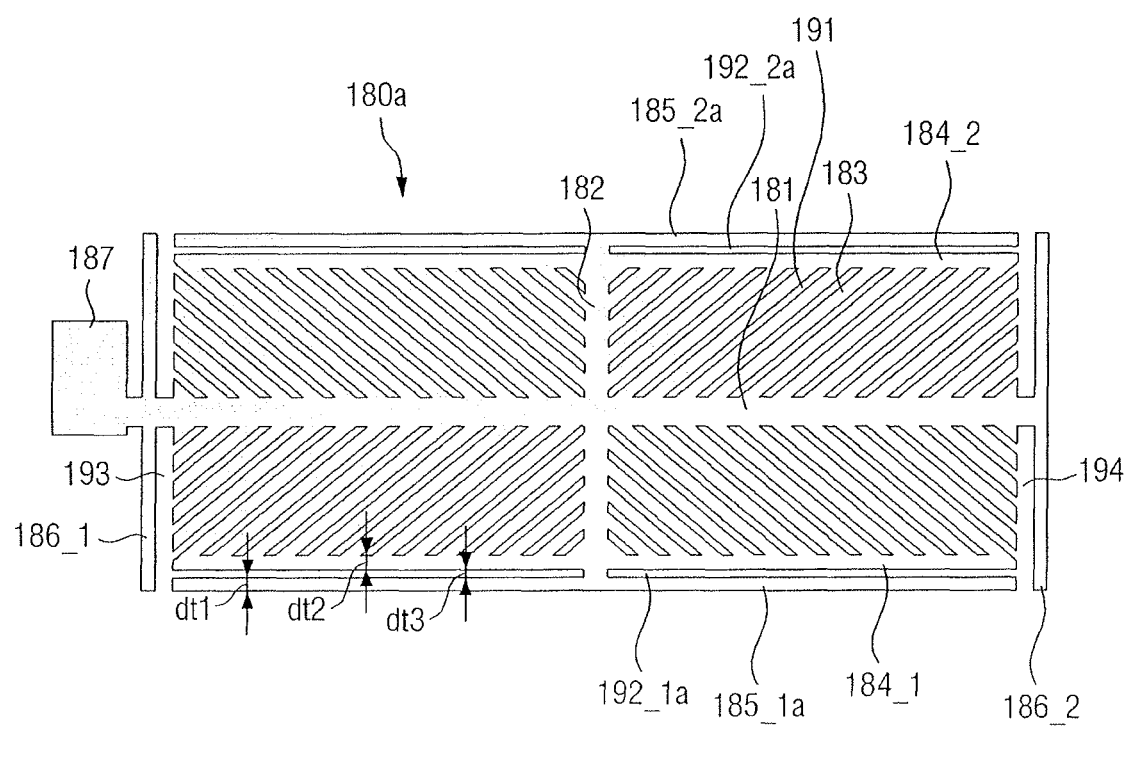
FIG. 11 illustrates a plan view of a pixel electrode of a liquid crystal display device according to another example embodiment.
Figure 11:
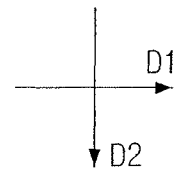

FIG. 11 is a plan view illustrating the pixel electrode of the liquid crystal display device according to another example embodiment.

As one example, FIG. 11 illustrates a structure that further includes a second edge electrode 185_2a in addition to the first edge electrode 185_1a, as compared to FIG. 4, and illustrates a structure that further includes a fifth fine slit 192_2a with the addition of the second edge electrode 185_2a.

Hereinafter, this structure will be described with reference to FIGS. 1 to 5 and 11. The pixel electrode 180a according to the present example embodiment further includes a second edge electrode 185_2a disposed adjacent to the second connection electrodes 184_2 as well as the first edge electrode 185_1a disposed adjacent to the first connection electrode 184_1. The second edge electrode 185_2a intersects with the distal end of the second stem electrode 182 and may extend along the first direction D1. Consequently, the pixel electrode 180a according to the present example embodiment may include the first edge electrode 185_1a and the second edge electrode 185_2a connected to both distal ends of the second stem electrode 182. For example, the arrangement of the first edge electrode 185_1a is not limited to be arranged only on one distal end of the second stem electrode 182.

The sum of a width dt1 of the first edge electrode 185_1a, a width dt2 of the first connection electrode 184_1 and a spaced distance dt3 between the first connection electrode 184_1 and the first edge electrode 185_1a may be, for example, 10.5 μm or less, which may help maintain a relatively high response speed of the liquid crystal display device. Here, the width dt1 of the first edge electrode 185_1a, the width dt2 of the first connection electrode 184_1, and the spaced distance dt3 between the first connection electrode 184_1 and the first edge electrode 185_1a are based on a length measured along the second direction D2.

For example, the width dt2 of the first connection electrode 184_1 may be less than 3 µm, and the spaced distance dt3 between the first connection electrode 184_1 and the first edge electrode 185_1a may be 2 µm or more and 4 µm or less.

The response speed will be further specifically described with reference to FIGS. 12 through 17.

Figure 12:
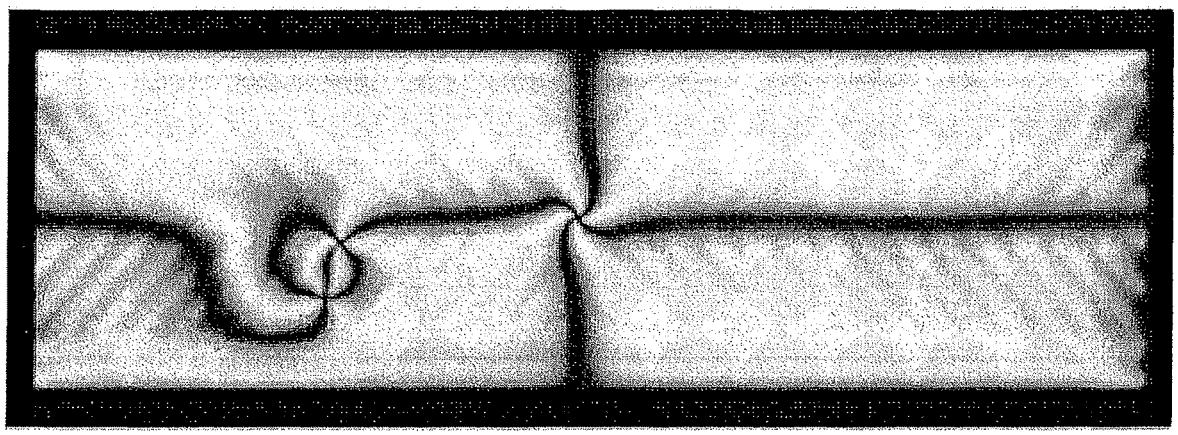
FIGS. 12 to 14 illustrate photographs of an active region for each time period in a case where a width of a first connection electrode is 2.6 μm.
Figure 13:
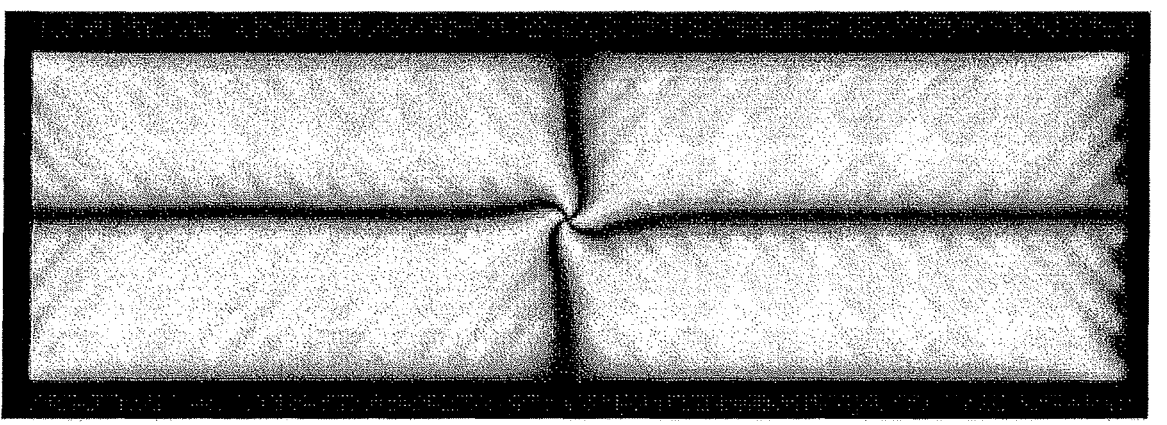
Figure 14:
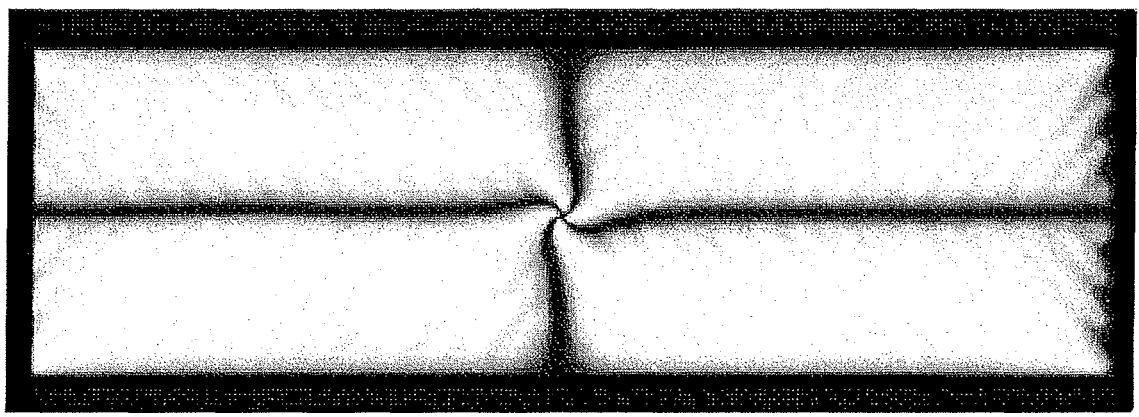
Figure 15:
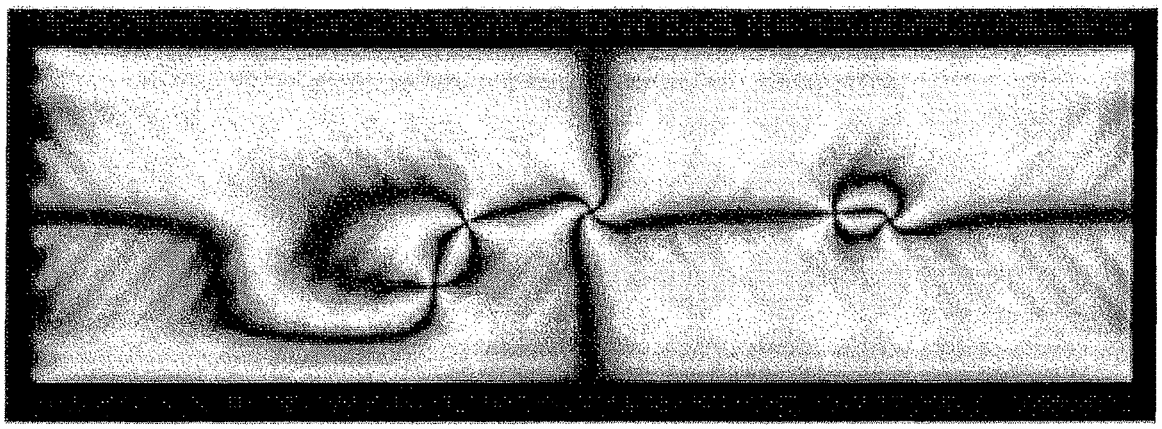
FIGS. 15 to 17 illustrate photographs of an active region for each time period in a case where the width of the first connection electrode is 3 μm.
Figure 16:
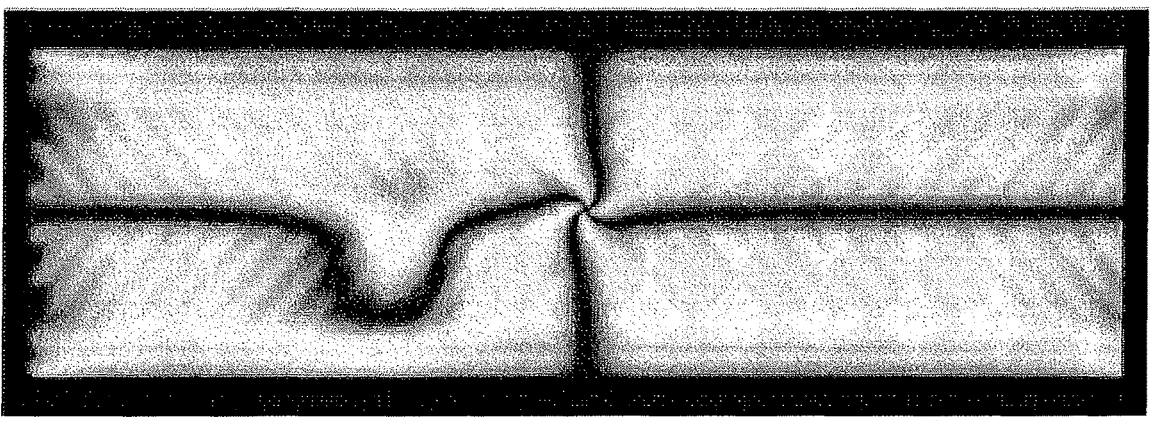
Figure 17:
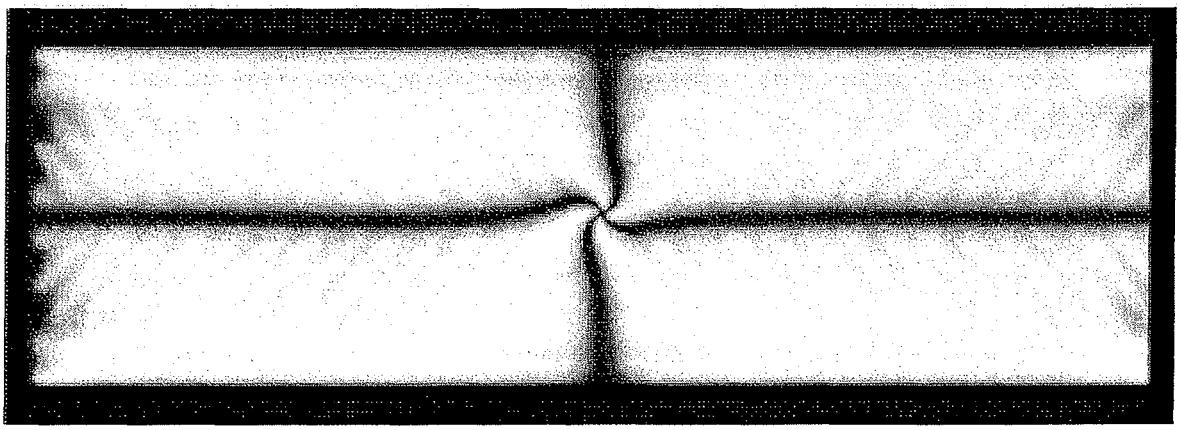

FIGS. 12 to 14 are photographs of the active region for each time period when the width of the first connection electrode is 2.6 µm, and FIGS. 15 to 17 are photographs of the active region for each time period when the width of the first connection electrodes is 3 µm.

Here, FIGS. 12 and 15 are photographs of the time when 1800 ms has passed from the time when the data signal begins to be provided to the pixel electrode 180a, FIGS. 13 and 16 are photographs of the time when 3000 ms has passed from the time when the data signal begins to be provided to the pixel electrode 180a, and FIGS. 14 and 17 are photographs of the time when 3600 ms has passed from the time when the data signal begins to be provided to the pixel electrode 180a.

Referring to FIG. 12 through 17, it is possible to check that the liquid crystal 210 is stabilized within 3600 ms in both of the case where the width dt2 of the first connection electrode 184_1 is 3 µm and the case of 2.6 µm. However, it is possible to check that, when the width dt2 of the first connection electrode 184_1 is 2.6 µm, the liquid crystal 210 is stabilized within 3000 ms, and meanwhile, when the width dt2 of the first connection electrode 184_1 is 3 µm, even if the 3000 ms has passed, the liquid crystal 210 is not stabilized. For example, it is possible to check that, when the width dt2 of the first connection electrode 184_1 is less than 3 µm, the liquid crystal 210 is further quickly stabilized, and the response speed is improved.

Figure 18:
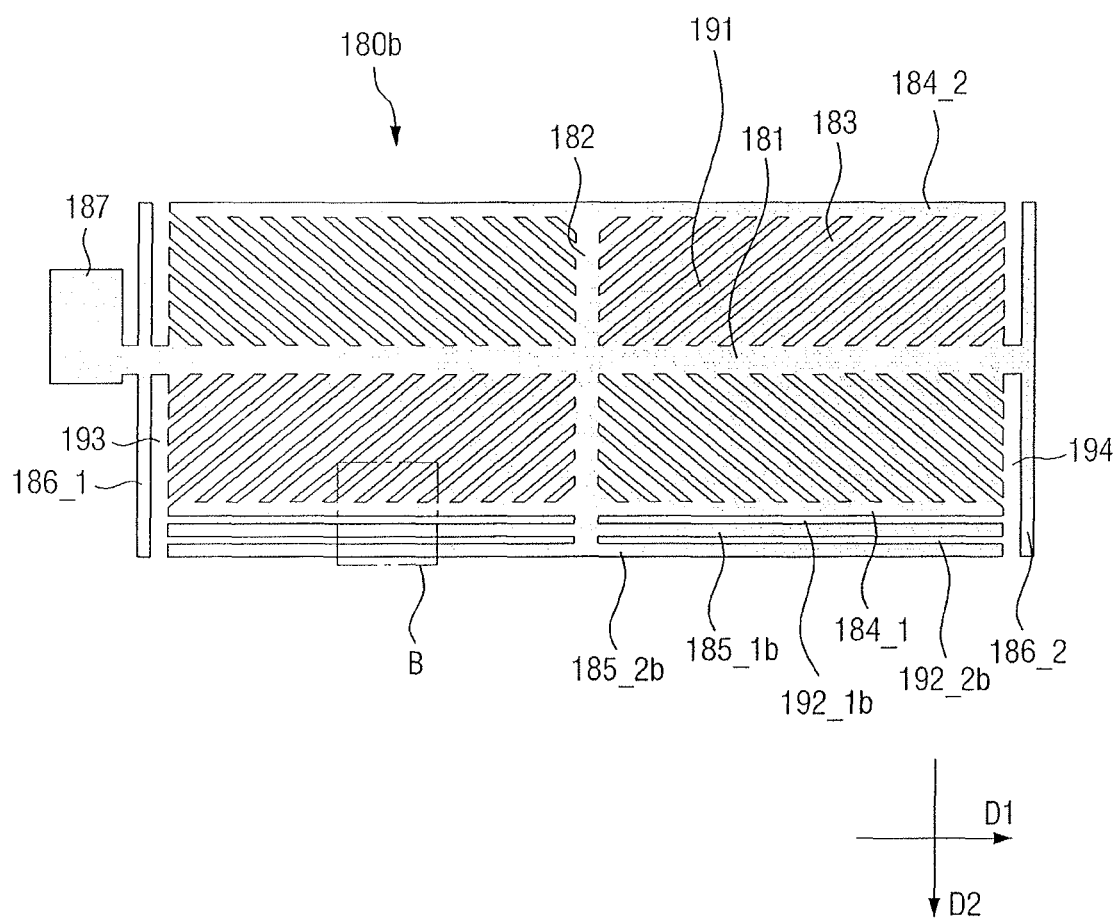
FIG. 18 illustrates a plan view of a pixel electrode of a liquid crystal display device according to another example embodiment.

FIG. 18 is a plan view illustrating the pixel electrode of the liquid crystal display device according to still another example embodiment.

For example, FIG. 18 illustrates a structure that further includes a second edge electrode 185_2b in addition to the first edge electrode 185_1b as compared to FIG. 4, and illustrates a structure that further includes a fifth fine slit 192_2b with the addition of the second edge electrode 185_2b.

Hereinafter, this structure will be described with reference to FIGS. 1 to 5 and 18. The pixel electrode 180b according to the present example embodiment further includes a second edge electrode 185_2b disposed adjacent to the first edge electrode 185_1b on the outside of the first edge electrode 185_1b, as well as the first edge electrode 185_1b disposed adjacent to the first connection electrode 184_1.

Thus, the first edge electrode 185_1b intersects with the second stem electrode 182 in a cross shape and extends along the first direction D1, and the second edge electrode 185_2b intersects with the distal end of the second stem electrode 182 and may extend along the first direction D1.

Further, the pixel electrode 180b may further include a fifth fine slit 192_2b disposed between the first edge electrode 185_1b and the second edge electrode 185_2b, as well as the second fine slit 192_1b disposed between the first connection electrodes 184_1 and the first edge electrode 185_1b.

Figure 19:
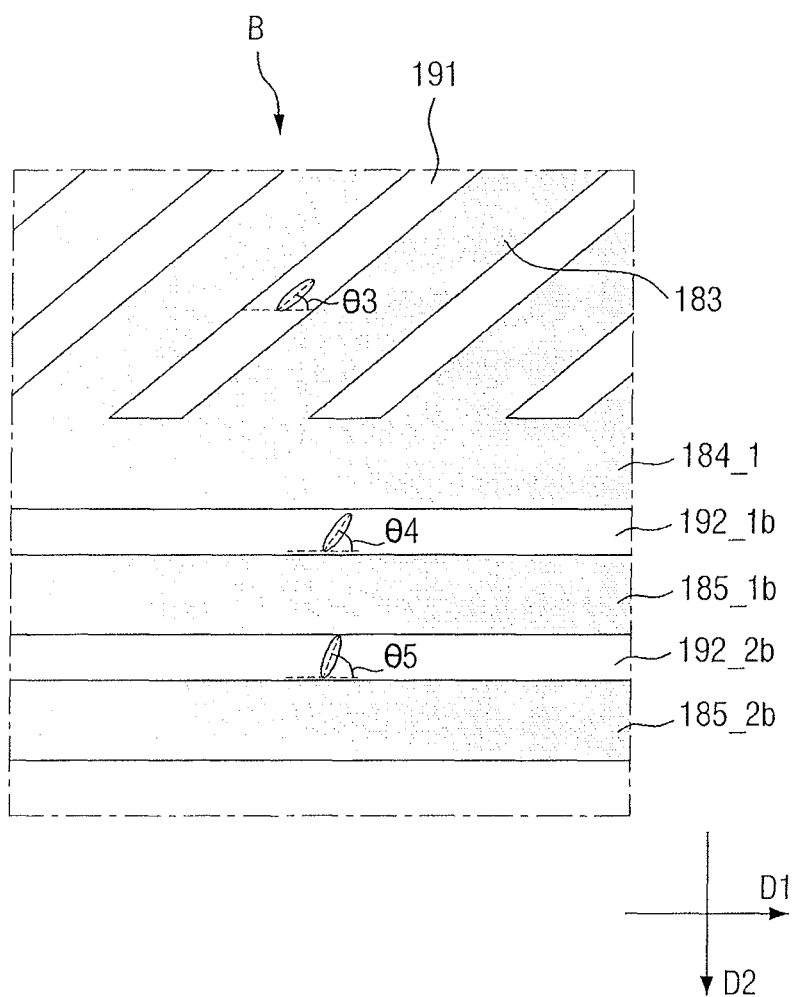
FIG. 19 illustrates an enlarged plan view illustrating a region B of FIG. 18.

FIG. 19 is an enlarged plan view illustrating a region B of FIG. 18.

Referring to FIG. 19, the liquid crystal 210 overlapping the first fine slit 191 may be tilted to form a third included angle θ3 with the first direction D1. The liquid crystal 210 overlapping the second fine slit 192_1b may be tilted to form a fourth included angle θ4 with the first direction D1. Further, the liquid crystal 210 overlapping the fifth fine slit 192_2b may be tilted to form a fifth included angle θ5 with the first direction D1.

Here, the degree of improvement in visibility may be compared by comparing the relationship between the third included angle θ3, the fourth included angle θ4 and the fifth included angle θ5 illustrated in FIG. 19 and the first included angle θ1 and the second included angle θ2 illustrated in FIG. 5. For example, the third included angle θ3 may be the same as the first included angle θ1, the fourth included angle θ4 may be the same as the second included angle θ2, and the fifth included angle θ5 may be smaller than the second included angle θ2. Without being bound by theory, it is believed that the reason is that, because the second edge electrode 185_2b and the first edge electrode 185_1b are included, the force which acts from the distal ends of the first edge electrode 185_1b and the second edge electrode 185_2b in the arrangement direction of the second stem electrode 182 is enhanced. Thus, the degree of improvement in visibility may be maximized.

Figure 20:
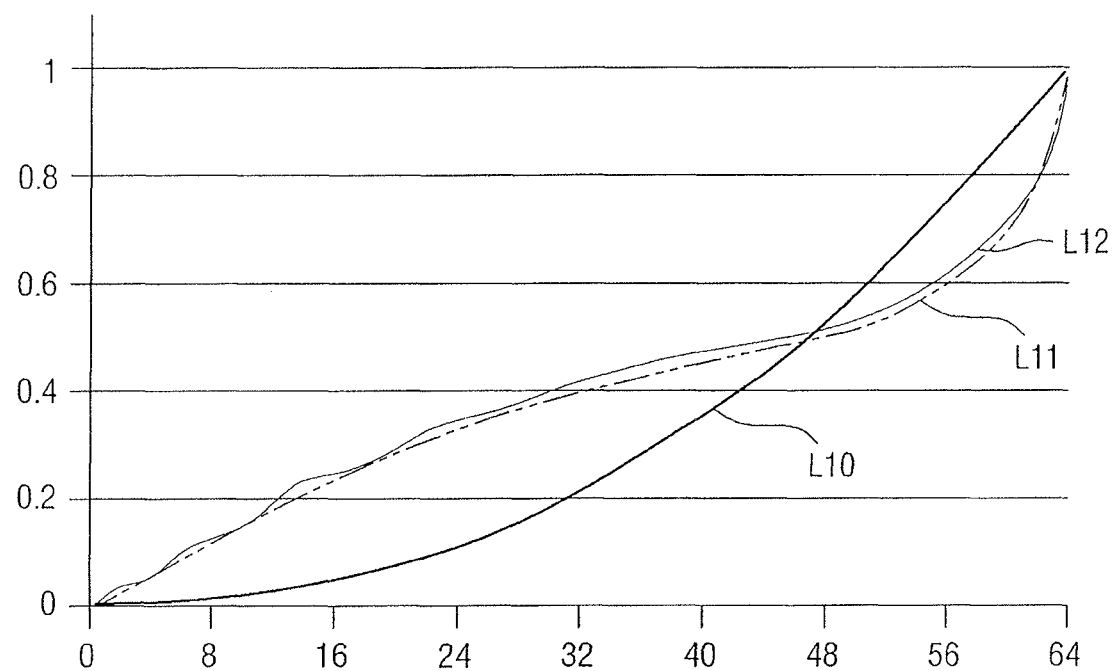
FIG. 20 illustrates a graph of the degree of improvement in visibility of the liquid crystal display device according to the embodiment illustrated in FIG. 18.

FIG. 20 is a graph illustrating the degree of improvement in visibility of the liquid crystal display device according to the embodiment illustrated in FIG. 18.

The x-axis of the graph in FIG. 20 represents the gradation of each pixel 10, and the y-axis represents the brightness. The maximum value of brightness represented by the y-axis is 100, and its unit is %. In this graph, the reference of the maximum value of brightness will be defined as a case where the liquid crystal display device having a gradation of 64 is viewed from the front.

A tenth line L10 in the graph of FIG. 20 represents brightness for each gradation when the liquid crystal display device according to the embodiment illustrated in FIG. 1 is viewed from the front, an eleventh line L11 represents brightness for each gradation when the liquid crystal display device according to the embodiment illustrated in FIG. 1 is viewed from the side, and a twelfth line L12 represents brightness for each gradation when the liquid crystal display device including the pixel electrode 180b according to the embodiment illustrated in FIG. 1 is viewed from the side.

Referring to FIG. 20, in most of the gradations, for example, in the gradations in the range of 0 to 48, the twelfth line L12 may be relatively closer to the tenth line L10 than the eleventh line L11. For example, in a certain gradation of the gradations in the range of 0 to 48, a difference in measured values along the twelfth line L12 and the tenth line L10 may be smaller than a difference in measured values along the eleventh line L11 and the tenth line L10. Consequently, it is possible to understand that the liquid crystal display device including the pixel electrode 180b according to the embodiment illustrated in FIG. 18 has a difference in front brightness smaller than that of the liquid crystal display device according to the embodiment illustrated in FIG. 1 in most gradation ranges. Accordingly, it is possible to check that the degree of improvement in the visibility of the liquid crystal display device including the pixel electrode 180b illustrated in FIG. 18 is maximized.

Figure 21:
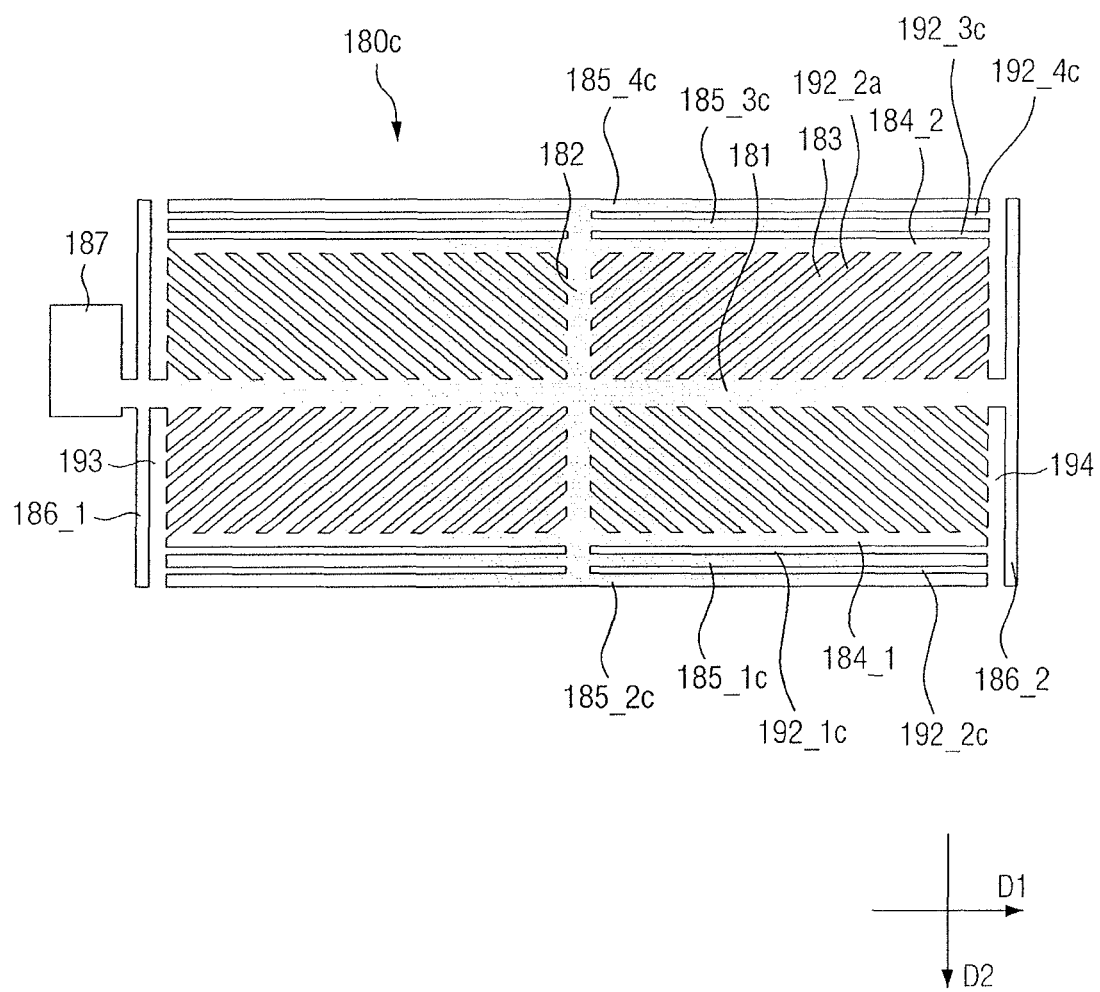
FIG. 21 illustrates a plan view of a pixel electrode of a liquid crystal display device according to still another example embodiment.

FIG. 21 is a plan view illustrating the pixel electrode of the liquid crystal display device according to another example embodiment.

For example, FIG. 21 illustrates a structure which further includes a second edge electrode 185_2c, a third edge electrode 185_3c and a fourth edge electrode 185_4c in addition to the first edge electrode 185_1c, as compared to FIG. 4, and illustrates a structure which further includes a fifth fine slit 192_2c, a sixth fine slit 192_3c and a seventh fine slit 192_4c with the addition of the second to fourth edge electrodes 185_2c, 185_3c and 185_4c.

Hereinafter, this structure will be described with reference to FIGS. 1 to 5 and 21. The pixel electrode 180c according to the present example embodiment further includes a second edge electrode 185_2c disposed adjacent to the first edge electrode 185_1c to be spaced apart therefrom on the outside of the first edge electrode 185_1c, as well as the first edge electrode 185_1c disposed adjacent to the first connection electrode 184_1. Further, the pixel electrode 180c further includes a third edge electrode 185_3c disposed adjacent to the second connection electrode 184_2 to be spaced apart therefrom, and a fourth edge electrode of 185_4c disposed adjacent to the outer side of the third edge electrode 185_3c to be spaced apart therefrom.

All of the first to fourth edge electrodes 185_1c, 185_2c, 185_3c, and 185_4c intersect with the second stem electrode 182, and may extend along the first direction D1. For example, the first edge electrode 185_1C and the second edge electrode 185_2c are disposed below the first stem electrode 181, and the third edge electrode 185_3c and the fourth edge electrode 185_4c may be disposed above the first stem electrode 181.

A second fine slit 192_1c as an opening portion extending in the first direction D1 may be disposed between the first connection electrode 184_1 and the first edge electrode 185. A fifth fine slit 192_2c as an opening portion extending in the first direction D1 may be disposed between the first edge electrode 185_1c and the second edge electrode 185_2c. Furthermore, a sixth fine slit 192_3c as an opening portion extending in the first direction D1 may be disposed between the second connection electrode 184_2 and the third edge electrode 185_3c, and a seventh fine slit 192_4c as an opening portion extending in the first direction D1 may be disposed between the third edge electrode 185_3c and the fourth edge electrode 185_4c.

Figure 22:
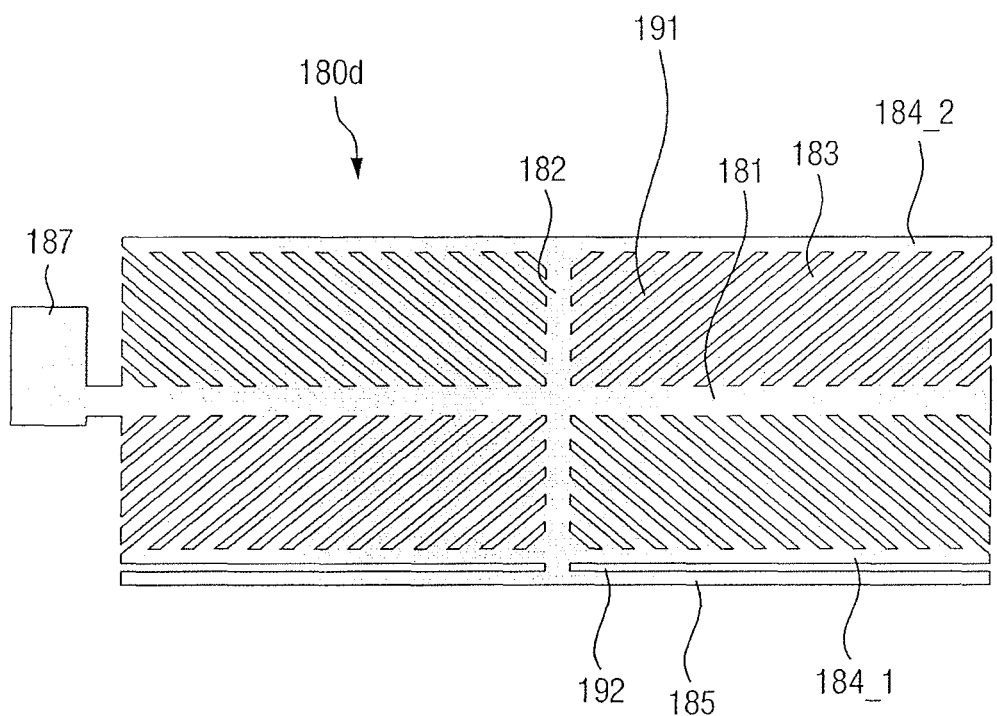
FIG. 22 illustrates a plan view of the pixel electrode of the liquid crystal display device according to still another example embodiment.

FIG. 22 is a plan view illustrating the pixel electrode of the liquid crystal display device according to still another example embodiment.

For example, FIG. 22 illustrates a structure in which the first auxiliary electrode 186_1 and the second auxiliary electrode 186_2 are removed as compared to FIG. 4 and illustrates a structure in which the third fine slit 193 and the fourth fine slit 194 are also removed with the removal of the first auxiliary electrode 186_1 and the second auxiliary electrode 186_2.

Hereinafter, this structure will be described with reference to FIGS. 1 to 5 and 22. The pixel electrode 180d according to the present example embodiment may be constituted to include only a first stem electrode 181, a second stem electrode 182, a branch electrode 183, a first connection electrode 184_1, a second connection electrode 184_2, a first edge electrode 185, and a protrusion 187. For example, the first auxiliary electrode 186_1 and the second auxiliary electrode 186_2 as illustrated in FIG. 4 may be omitted.

Figure 23:
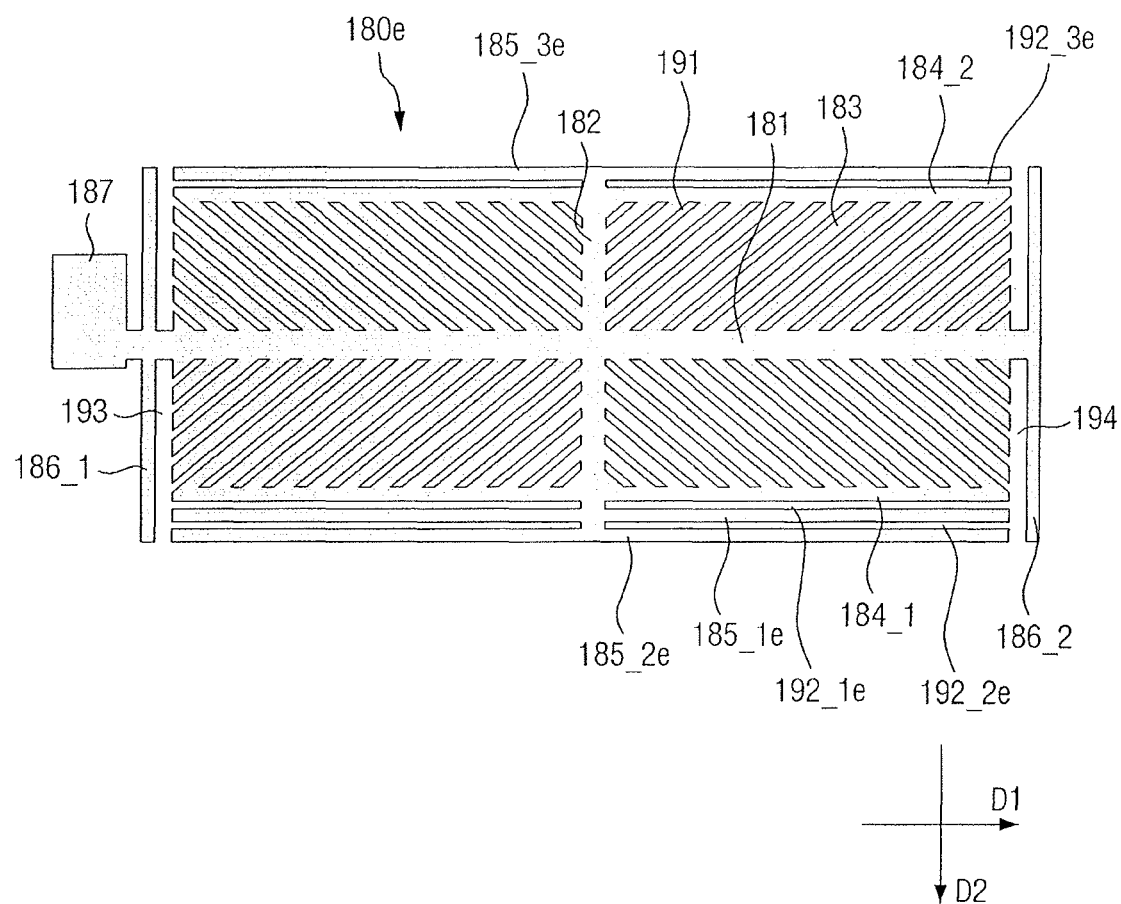
FIG. 23 illustrates a plan view of the pixel electrode of the liquid crystal display device according to still another example embodiment.

FIG. 23 is a plan view illustrating the pixel electrode of the liquid crystal display device according to still another example embodiment.

For example, FIG. 23 illustrates a structure that further includes a second edge electrode 185_2e and a third edge electrode 185_3e in addition to the first edge electrode 185_1e as compared to FIG. 4, and illustrates a structure that further includes a fifth fine slit 192_2e and a sixth fine slit 192_3e with the addition of the second edge electrode 185_2e and third edge electrode 185_3e.

Hereinafter, this structure will be described with reference to FIGS. 1 to 5 and 23. The pixel electrode 180e according to the present example embodiment includes the first edge electrode 185_1e, the second edge electrode 185_2e, and the third edge electrode 185_3e. Here, the first edge electrode 185_1e and the second edge electrode 185_2e are disposed below the first stem electrode 181, and the third edge electrode 185_3e may be disposed above the first stem electrode 181. For example, the number of edge electrodes disposed on both sides based on the first stem electrode 181 may be different.

Figure 24:
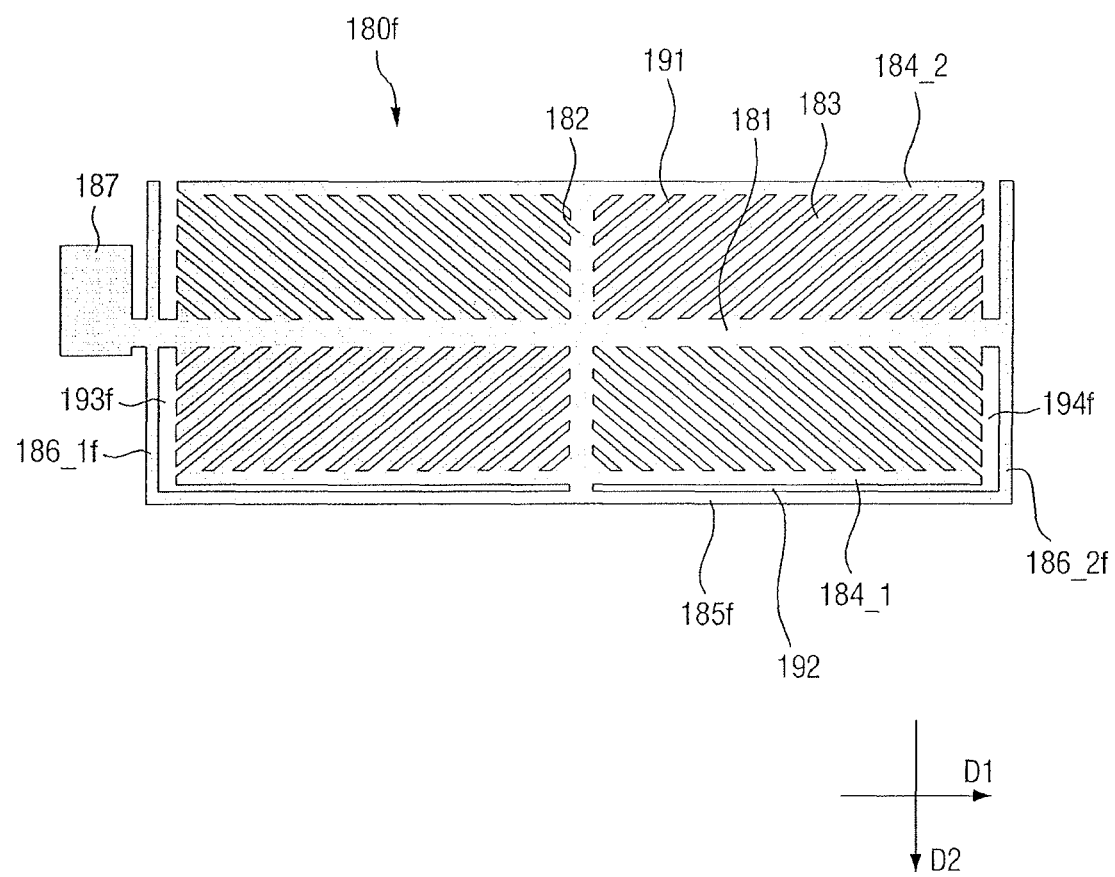
FIG. 24 illustrates a plan view of the pixel electrode of the liquid crystal display device according to still another example embodiment.

FIG. 24 is a plan view illustrating the pixel electrode of the liquid crystal display device according to still another example embodiment.

For example, FIG. 24 differs from FIG. 4 in that the first edge electrode 185f is connected to the first auxiliary electrode 186_1f and the second auxiliary electrode 186_2f. Thus, the extended lengths of the third fine slit 193f and the fourth fine slit 194F along the second direction D2 may become relatively short.

Hereinafter, this structure will be described with reference to FIGS. 1 to 4 and 24. The first edge electrode 185f of the pixel electrode 180f according to the present example embodiment is connected to the distal end of the second stem electrode 182, and may be connected to the distal ends of the first auxiliary electrode 186_1f and the second auxiliary electrode 186_2f. Thus, controllability of the liquid crystal 210 disposed in a region in which the first edge electrode 185f and the first auxiliary electrode 186_1f are connected to each other and in a region in which the first edge electrode 185f and the second auxiliary electrode 186_2f are connected to each other is improved, and the effect of improving the visibility may be further maximized.

Figure 25:
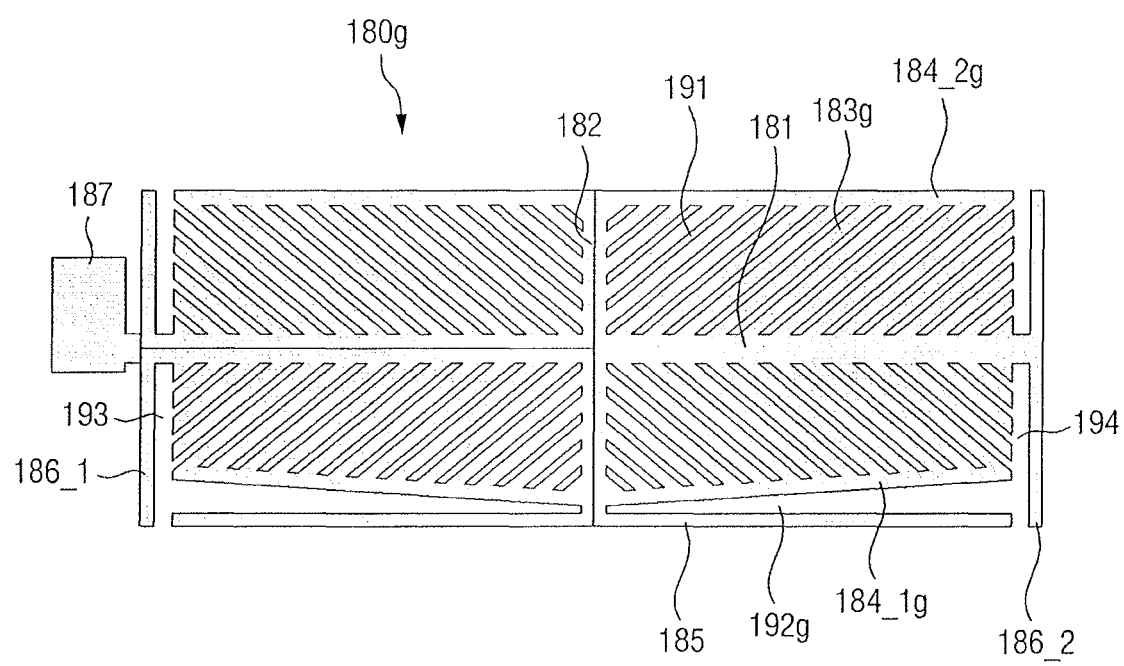
FIG. 25 illustrates a plan view of the pixel electrode of the liquid crystal display device according to still another example embodiment.

FIG. 25 is a plan view illustrating the pixel electrode of the liquid crystal display device according to still another example embodiment.

For example, FIG. 25 differs from FIG. 4 in that the first connection electrode 184_1g extends in an oblique direction to the first direction D1. Thus, the extended width of the second fine slit 192g in the second direction D2 may also be different depending on the positions.

Hereinafter, this structure will be described with reference to FIGS. 1 to 4 and 25. The first connection electrode 184_1g of the pixel electrode 180g according to the present example embodiment may extend obliquely in the first direction D1. The first connection electrode 184_1g may have an axisymmetric shape on the basis of the second stem electrode 182. Thus, the extended width of the second fine slit 192g in the second direction D2 may increase as it is away from the second stem electrode 182. Thus, the spaced distance between the first edge electrode 185 and the first connection electrode 184_1g may increase as it is away from the second stem electrode 182.

Figure 26:
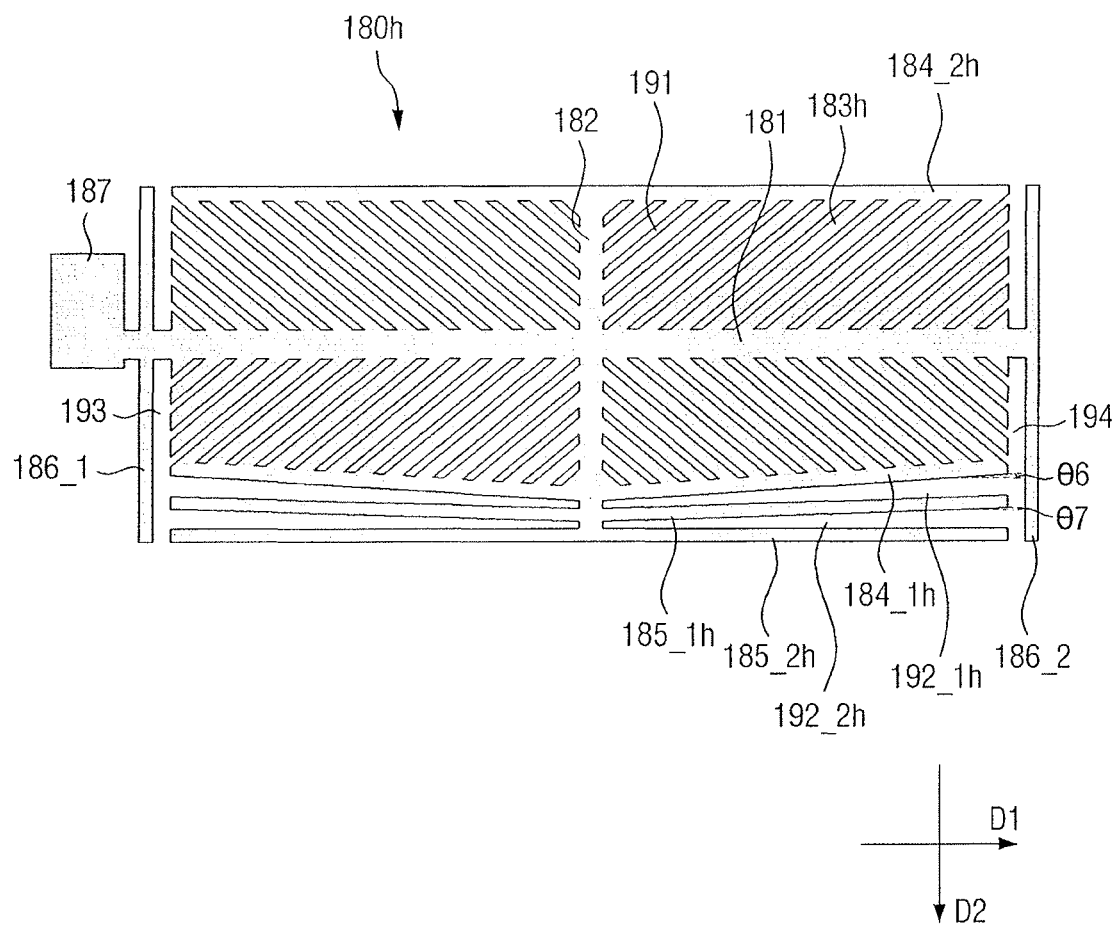
FIG. 26 illustrates a plan view of the pixel electrode of the liquid crystal display device according to still another example embodiment.

FIG. 26 is a plan view illustrating the pixel electrode of the liquid crystal display device according to still another example embodiment.

For example, FIG. 26 illustrates a structure that further includes a second edge electrode 185_2h in addition to the first edge electrode 185_1h as compared to FIG. 4, and illustrates a structure that further includes a fifth fine slit 192_2h with the addition of the second edge electrode 185_2h. Furthermore, the first connection electrode 184_1h and the first edge electrode 185_1h may extend obliquely in the first direction D1.

Hereinafter, this structure will be described with reference to FIGS. 1 to 5 and 26. The first connection electrode 184_1h and the first edge electrode 185_1h of the pixel electrode 180h according to the present example embodiment may extend obliquely in the first direction D1. For example, the first connection electrode 184_1h may extend to form a sixth included angle θ6 with the first direction D1, and the first edge electrode 185_1h may extend to form a seventh included angle θ7 with the first direction D1. Here, the seventh included angle θ7 may be greater than the sixth included angle θ6. Thus, the extended width of the second fine slit 192_1h in the second direction D2 and the extended width of the fifth fine slit 192_2h in the second direction D2 may increase as both the extended widths are away from the second stem electrode 182. Thus, the spaced distance between the first edge electrode 185_1h and the first connection electrode 184_1h may increase as it is farther away from the second stem electrode 182, and the spaced distance between the first edge electrode 185_1h and the second edge electrode 185_2h may also increase as it is away from the second stem electrode 182.

Figure 27:
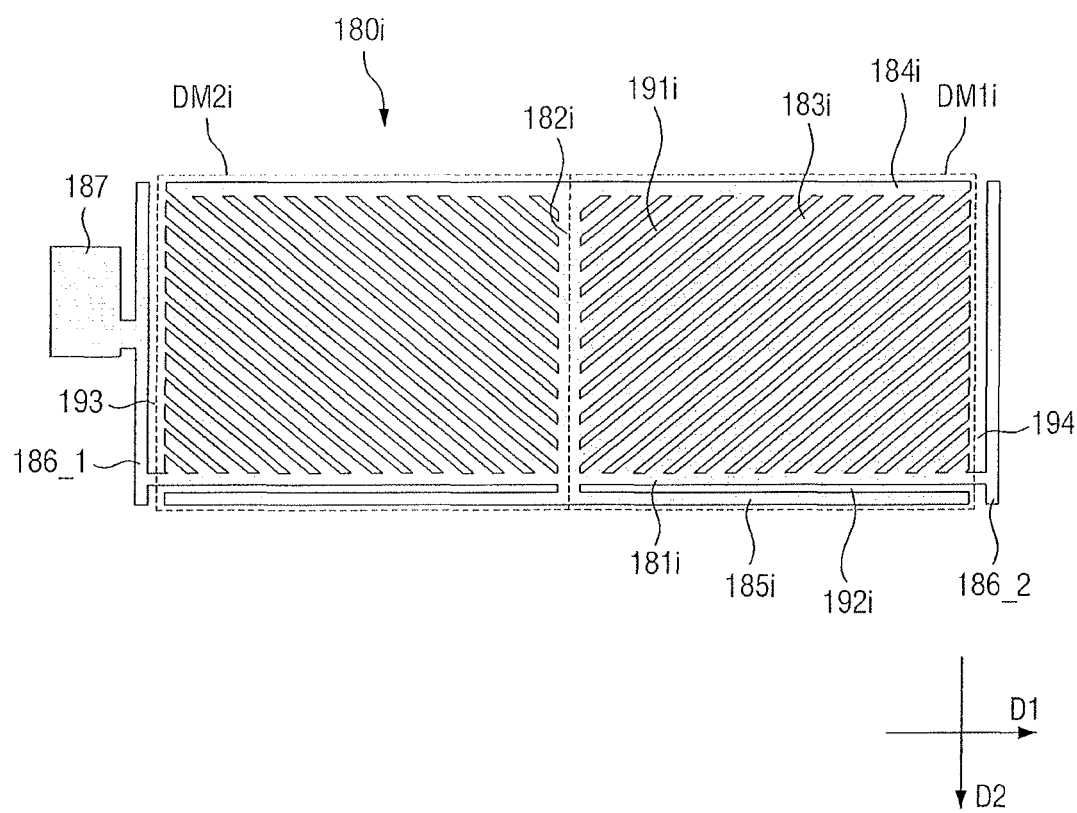
FIG. 27 illustrates a plan view of the pixel electrode of the liquid crystal display device according to still another example embodiment.

FIG. 27 is a plan view illustrating the pixel electrode of the liquid crystal display device according to still another example embodiment.

For example, FIG. 27 illustrates a structure in which the third domain region DM3 and the fourth domain region DM4 are removed and only a first domain region DM1i and a second domain region DM2i are included as compared to FIG. 4.

Hereinafter, this structure will be described with reference to FIGS. 1 to 5 and 27. The pixel electrode 180 according to the present example embodiment includes a first stem electrode 181i extending along the first direction D1, a second stem electrode 182i intersecting with the first stem electrode 181i and extending along the second direction D2, and a plurality of branch electrodes 183i extending in the oblique direction to the first direction D1 and the second direction D2 from the first stem electrode 181i and the second stem electrode 182i. The first connection electrode 184i is disposed to connect the distal ends of the branch electrodes 183i disposed in the first domain region DM1i and the second domain region DM2i with each other and may be disposed to intersect with the second stem electrode 182i.

The first edge electrode 185i is disposed adjacent to the first stem electrode 181i to be spaced apart therefrom, and is disposed parallel to the first stem electrodes 181i. Thus, a second fine slit 192i may be formed between the first stem electrode 181i and the first edge electrode 185i.

For example, even if some of the first to fourth domain regions DM1, DM2, DM3, and DM4 of the embodiment illustrated in FIG. 4 are omitted, it is also possible to improve the visibility as in the pixel electrode 180i according to the embodiment illustrated in FIG. 27.

Figure 28:
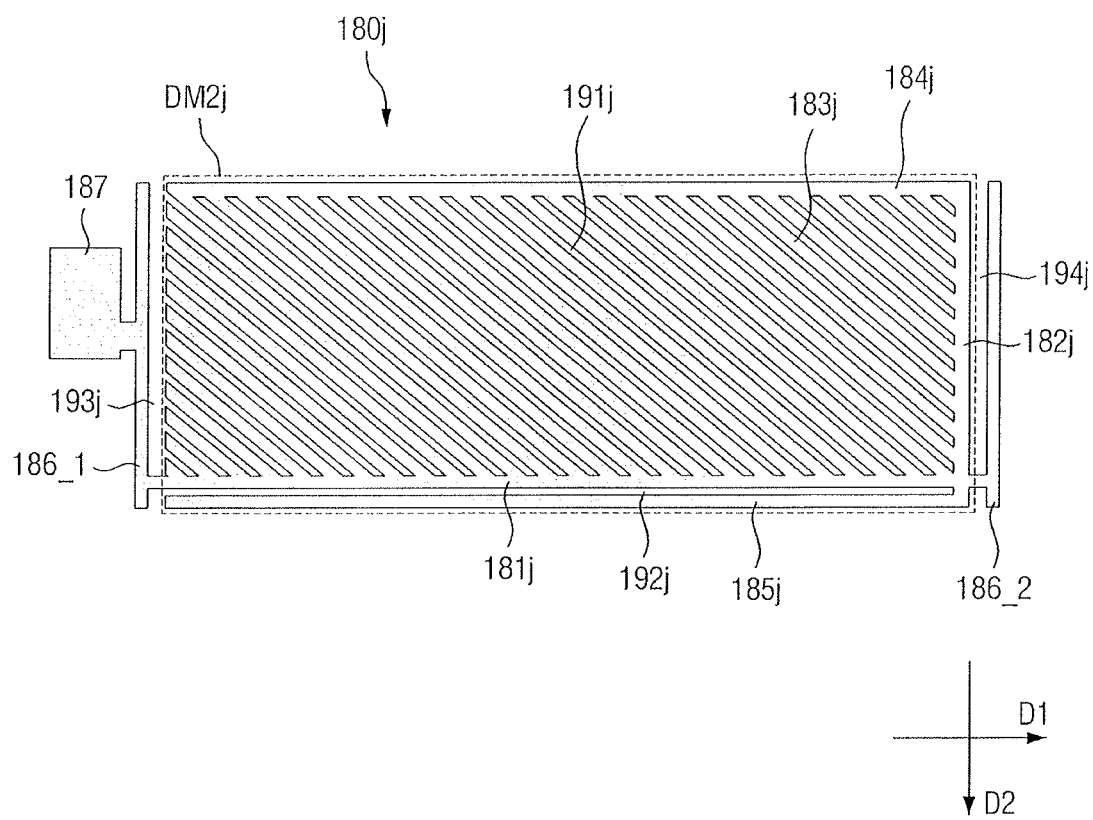
FIG. 28 illustrates a plan view of the pixel electrode of the liquid crystal display device according to still another example embodiment.

FIG. 28 is a plan view illustrating the pixel electrode of the liquid crystal display device according to still another example embodiment.

For example, FIG. 28 illustrates a structure in which the first domain region DM1, the third domain region DM3 and the fourth domain region DM4 are removed and only the second domain region DM2j is included as compared to FIG. 4.

Hereinafter, this structure will be described with reference to FIGS. 1 to 5 and 28. The pixel electrode 180j according to the present example embodiment includes a first stem electrode 181j extending along the first direction D1, a second stem electrode 182j intersecting with the first stem electrode 181j and extending along the second direction D2, and a plurality of branch electrodes 183j extending in an oblique direction to the first direction D1 and the second direction D2 from the first stem electrode 181j and the second stem electrode 182j. The first connection electrode 184j is disposed to connect the distal ends of the branch electrodes 183j disposed in the second domain region DM2j, and may be disposed to intersect with the second stem electrode 182j. The branch electrodes 183j may be disposed only in the second domain region DM2j.

The first edge electrode 185j is disposed adjacent to the first stem electrode 181j to be spaced apart therefrom, and is disposed parallel to the first stem electrodes 181j. Thus, a second fine slit 192j may be formed between the first stem electrode 181j and the first edge electrode 185j.

For example, even if all the rest except one domain region among the first to fourth domain regions DM1, DM2, DM3, and DM4 of the embodiment illustrated in FIG. 4 are omitted, it is possible to improve the visibility as in the pixel electrode 180j according to the embodiment illustrated in FIG. 28.

Figure 29:
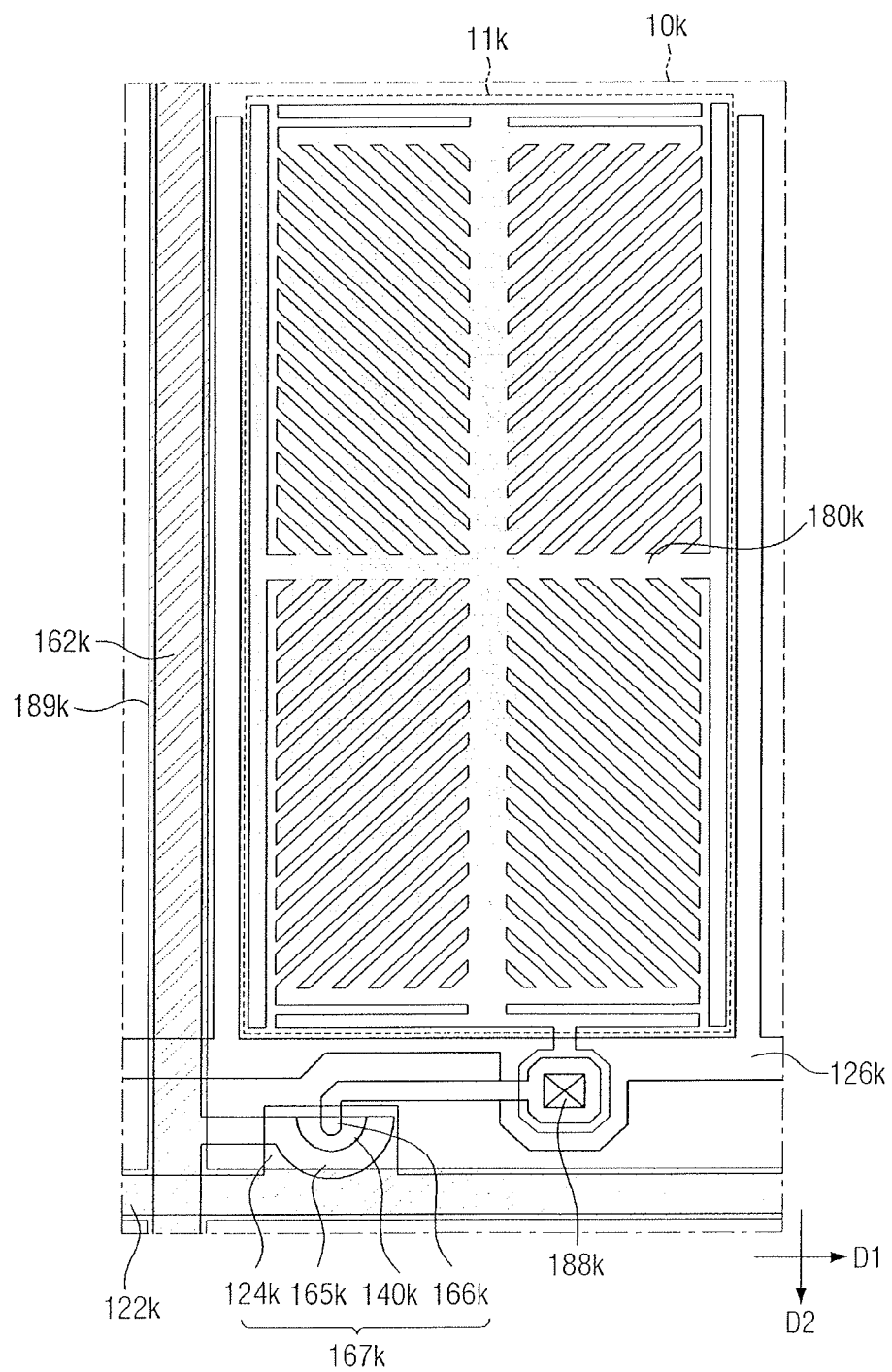
FIG. 29 illustrates a layout diagram of a single pixel of the liquid crystal display device according to still another example embodiment.
Figure 30:
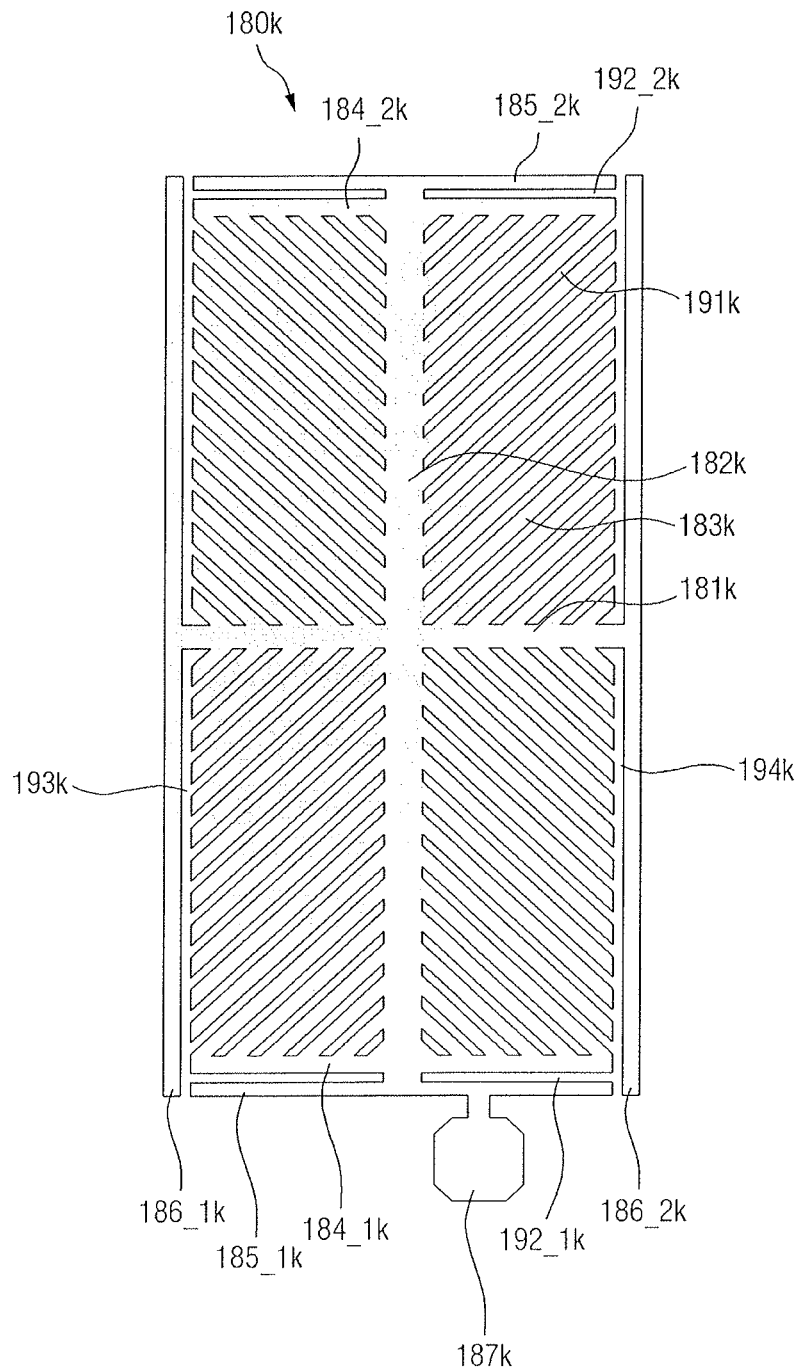
FIG. 30 illustrates an enlarged plan view illustrating the pixel electrode of FIG. 29.

FIG. 29 is a layout diagram of a single pixel of a liquid crystal display device according to still another example embodiment, and FIG. 30 is an enlarged plan view illustrating the pixel electrode of FIG. 29.

Referring to FIG. 29, a single pixel 10k of the liquid crystal display device according to the present example embodiment includes an active region 11k, a gate line 122k, a gate electrode 124k, a sustain electrode 126k, a semiconductor layer 140k, a source electrode 165k, a drain electrode 166k, a pixel electrode 180k, a shielding electrode 189k and a contact hole 188k. Further, the pixel electrode 180k includes a first stem electrode 181k, a second stem electrode 182k, a branch electrode 183k, a first connection electrode 184_1k, a second connection electrode 184_2k, a first edge electrode 185_1k, a second edge electrode 185_2k, a first auxiliary electrode 186_1k, a second auxiliary electrode 186_2k, and a protrusion 187k, and includes a first fine slit 191k, a second fine slit 192k, a third fine slit 193k and a fourth fine slit 194k as opening portions according to the structure of the pixel electrode 180k.

Here, the related description may be applied to the configurations corresponding to the configurations according to the embodiments illustrated in FIGS. 1 and 4 among the respective configurations illustrated in FIGS. 29 and 30, unless there is separate explanation. Thus, differences from the configurations illustrated in FIGS. 1 and 4 among the respective configurations illustrated in FIGS. 29 and 30 will be mainly described.

Referring to FIGS. 1, 4, 29, and 30, a single pixel 10k of the liquid crystal display device according to the present example embodiment may have the width extending along the second direction D2 longer than the width extending along the first direction D1. Further, the length of the second stem electrode 182k extending along the second direction D2 in the active region 11k may be longer than the length of the first stem electrode 181k extending along the first direction D1 in the active region 11k. For example, the extension direction of the long axis of the pixel 10 in the embodiment illustrated in FIGS. 1 and 4 may be changed, and the relative length relationship between the first stem electrode 181 and the second stem electrode 182 may also be changed. However, according to the present example embodiment, since the extended lengths of the first electrode 183k and the second electrode 183k along the first direction D1 become relatively short, the degree of improvement in visibility and the degree of improvement in transmittance may be partially reduced as compared to the degree of improvement in visibility and the degree of improvement in transmittance illustrated in FIGS. 1 and 4.

Figure 31:
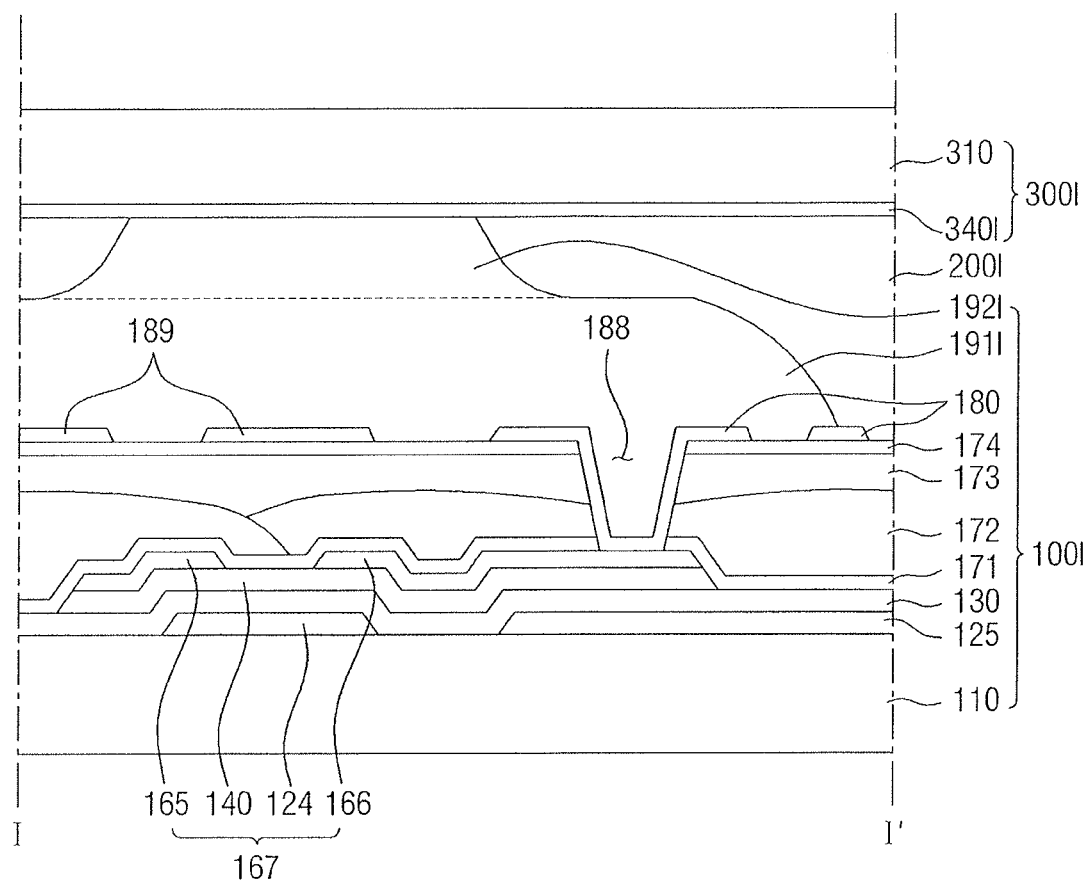
FIG. 31 illustrates a cross-sectional view taken along a line corresponding to the line I-I' illustrated in FIG. 1 in a liquid crystal display device according to still another example embodiment.
Figure 32:
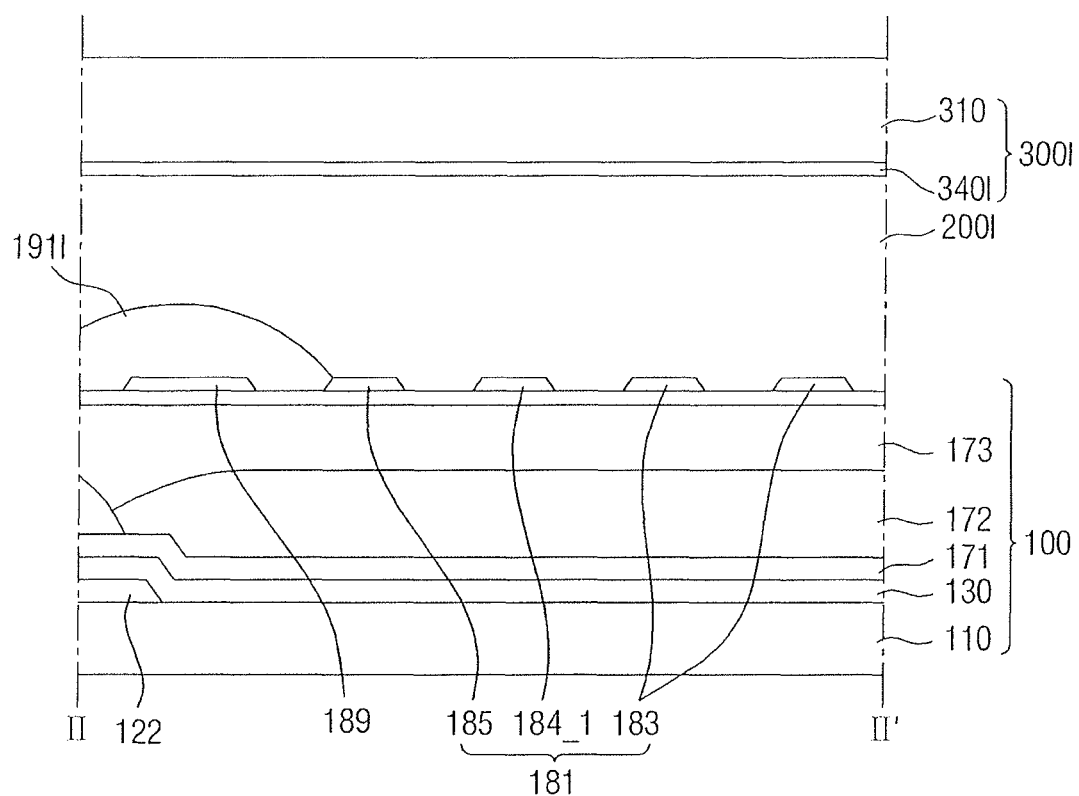
FIG. 32 illustrates a cross-sectional view taken along a line corresponding to the line I-I' illustrated in FIG. 1 in the liquid crystal display device according to the embodiment illustrated in FIG. 31.

FIG. 31 is a cross-sectional view taken along a line corresponding to the line I-I' illustrated in FIG. 1 in a liquid crystal display device according to still another example embodiment, and FIG. 32 is a cross-sectional view taken along a line corresponding to the line I-I' illustrated in FIG. 1 in the liquid crystal display device according to the embodiment illustrated in FIG. 31.

For example, the embodiments according to FIGS. 31 and 32 illustrate a structure in which a column spacer 191*l* and a spacer 192*l* are further included and a light-shielding member 320 and an overcoat layer 330 are omitted as compared to FIGS. 2 and 3.

Hereinafter, this structure will be described with reference to FIGS. 1 to 3 and 31 and 32. The liquid crystal display device according to the present example embodiment includes a column spacer 191*l* which is disposed to correspond to a region in which the light-shielding member 320 of FIGS. 1 to 3 is disposed. The column spacer 191*l* may not transmit light and may cut off light provided from the bottom. As the column spacer 191*l* cuts off the light, the light-shielding member 320 illustrated in FIGS. 1 through 3 may be omitted. As the light-shielding member 320 is omitted, the overcoat layer 330 illustrated in FIGS. 1 to 3 may also be omitted. Accordingly, the common electrode 340*l* may be directly disposed on a surface of the first base substrate 110.

Also, the liquid crystal display device may further include a spacer 192*l* for maintaining a space in which the liquid crystal layer 200*l* is formed. The spacer 192*l* may be formed integrally with the column spacer 191*l*, and may be formed in a region on which the thin film transistor 167 is disposed.

The column spacer 191*l* may be disposed between the pixels 10 adjacent to each other to extend along the first direction D1. However, because the column spacer 191*l* may form a step, it may tilt the liquid crystal 210. Therefore, in the case of the liquid crystal display device formed with the column spacer 191*l*, the visibility may be lowered along the edge which extends along the first direction D1, among the edges of the active region 11. In this case, since the first electrode 183 is disposed, it is possible to maximize the effect of improving the visibility.

By way of summation and review, among the liquid crystal display devices, vertically alignment mode liquid crystal display devices have been developed in which a long axis of the liquid crystal is arrayed to be perpendicular to the upper and lower substrates in a state in which no electric field is applied.

The vertical alignment mode liquid crystal display devices may have poorer lateral visibility than front visibility. For example, the liquid crystal display device may be more brightly visible when viewed from the side than when viewed from the front, and as the brightness difference between the front and the side is large, the visibility gets worse.

As described above, embodiments may provide a liquid crystal display device with improved visibility.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A liquid crystal display device, comprising:
a substrate; and
a pixel electrode disposed on the substrate, the pixel electrode comprising:
a first stem portion that extends in a first direction;
a second stem portion that extends in a second direction crossing the first direction, the second stem portion intersecting with the first stem portion;
a first edge portion that extends in the first direction and electrically connected to the second stem portion;
a plurality of branch portions, each of the plurality of branch portions extending to a direction intersecting the first direction and the second direction from the first stem portion;
a second edge portion that extends in the second direction; and
a first portion that extends from one distal end of the first edge portion in the first direction, wherein
the second edge portion extends from one distal end of the first portion in the second direction,
a length of the first stem portion in the first direction is longer than a length of the second stem portion in the second direction,
each of the plurality of branch portions is disposed between the first stem portion and the first edge portion in the second direction,
each of the plurality of branch portions is disposed between the second stem portion and the second edge portion in the first direction, and
the second edge portion is spaced apart from each of the plurality of branch portions.

2. The liquid crystal display device of claim 1, wherein a length of the first edge portion in the first direction is longer than a length of the second edge portion in the second direction.

3. The liquid crystal display device of claim 1, wherein the plurality of the branch portions of the pixel electrode, the first edge portion of the pixel electrode, the second edge portion of the pixel electrode and the first stem portion of the pixel electrode are disposed directly on a same layer and include a same material.

4. The liquid crystal display device of claim 1, wherein a width of the first edge portion in the second direction is substantially the same as a width of the first portion of the pixel electrode in the second direction.

5. The liquid crystal display device of claim 1, wherein the pixel electrode further comprises:
a third edge portion that extends in the second direction; and
a second portion that extends from another distal end of the first edge portion in the first direction, wherein
the third edge portion extends from one distal end of the second portion in the second direction, and
the second stem portion is disposed between the second edge portion and the third edge portion in the first direction.

6. The liquid crystal display device of claim 5, wherein the first stem portion is separated from the third edge portion.

7. The liquid crystal display device of claim 1, wherein the first stem portion is separated from the second edge portion.

8. The liquid crystal display device of claim 1, further comprising:

a first connection electrode extending in the second direction that connects a distal end of the first stem portion to the first edge portion, wherein the first connection electrode is disposed between the second stem portion and the second edge portion.

9. A liquid crystal display device, comprising:

a substrate; and a pixel electrode disposed on the substrate, wherein the pixel electrode comprises:
- a plurality of first slits parallel to each other;
- a plurality of second slits parallel to each other obliquely arranged to the first slits;
- a plurality of third slits parallel to each other obliquely arranged to the second slits;
- a plurality of fourth slits parallel to each other obliquely arranged to the third slits;
- a stem portion of the pixel electrode positioned between the plurality of first slits and the plurality of second slits, between the plurality of second slits and the plurality of third slits, between the plurality of third slits and the plurality of fourth slits, and between the plurality of fourth slits and the plurality of first slits;
- a plurality of branch portions of the pixel electrodes positioned between the plurality of first slits, the plurality of second slits, the plurality of third slits, and the plurality of fourth slits; and
- at least one fifth slit parallel to a first portion of the stem portion, and wherein a portion of the plurality of branch portions is disposed between the at least one fifth slit and the first portion of the stem portion which is parallel to the at least one fifth slit.

10. The liquid crystal display device of claim 9, wherein the pixel electrode further comprises a connection portion of the pixel electrode positioned between at least one fifth slit and one of the first slits, the second slits, the third slits, and the fourth slits, and the connection portion is parallel to a portion of the stem portion.

11. The liquid crystal display device of claim 10, further comprising:

a light shielding pattern which overlaps the stem portion of the pixel electrode in a plan view.

12. The liquid crystal display device of claim 11, wherein the stem portion of the pixel electrode has a cross shape.

13. The liquid crystal display device of claim 12, wherein an inclined angle between one of the plurality of the third slits and a portion of the stem portion which is extended in a first direction is about 45°.

14. The liquid crystal display device of claim 9, further comprising:

a gate line; and a data line, wherein a portion of the stem portion of the pixel electrode parallels a portion of the gate line or the data line.

15. The liquid crystal display device of claim 14, further comprising:

a light shielding pattern which overlaps the stem portion of the pixel electrode in a plan view.

16. The liquid crystal display device of claim 15, wherein the stem portion of the pixel electrode has a cross shape.

* * * * *